United States Patent
Prabhu et al.

(10) Patent No.: US 9,911,718 B2
(45) Date of Patent: Mar. 6, 2018

(54) 'RDL-FIRST' PACKAGED MICROELECTRONIC DEVICE FOR A PACKAGE-ON-PACKAGE DEVICE

(71) Applicant: Invensas Corporation, San Jose, CA (US)

(72) Inventors: Ashok S. Prabhu, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/353,552

(22) Filed: Nov. 16, 2016

(65) Prior Publication Data

US 2017/0141042 A1    May 18, 2017

Related U.S. Application Data

(60) Provisional application No. 62/257,223, filed on Nov. 18, 2015, provisional application No. 62/256,699, filed on Nov. 17, 2015.

(51) Int. Cl.
*H01L 21/76* (2006.01)
*H01L 25/065* (2006.01)
(Continued)

(52) U.S. Cl.
CPC ........ *H01L 25/0657* (2013.01); *H01L 21/288* (2013.01); *H01L 21/486* (2013.01);
(Continued)

(58) Field of Classification Search
CPC ............... H01L 23/5389; H01L 21/565; H01L 21/4853; H01L 23/3114; H01L 25/50;
(Continued)

(56) References Cited

U.S. PATENT DOCUMENTS 3,289,452 A    12/1966   Koellner
3,358,897 A    12/1967   Christensen
(Continued)

FOREIGN PATENT DOCUMENTS

CN    1352804 A    6/2002
CN    1641832 A    7/2005
(Continued)

OTHER PUBLICATIONS

International Search Report and Written Opinion for Appln. No. PCT/US2013/041981, dated Nov. 13, 2013.
(Continued)

*Primary Examiner* — Roy Potter
*Assistant Examiner* — Paul Patton

(57) ABSTRACT

Methods and apparatuses relate generally to a packaged microelectronic device for a package-on-package device ("PoP") with enhanced tolerance for warping. In one such packaged microelectronic device, at least one redistribution layer includes first interconnect pads on a lower surface and second interconnect pads on an upper surface of the at least one redistribution layer. Interconnect structures are on and extend away from corresponding upper surfaces of the second interconnect pads. A microelectronic device is coupled to an upper surface of the at least one redistribution layer. A dielectric layer surrounds at least portions of shafts of the interconnect structures. The interconnect structures have upper ends thereof protruding above an upper surface of the dielectric layer a distance to increase a warpage limit for a combination of at least the packaged microelectronic device and one other packaged microelectronic device directly coupled to protrusions of the interconnect structures.

18 Claims, 15 Drawing Sheets

(51) Int. Cl.
| | |
|---|---|
| *H01L 21/768* | (2006.01) |
| *H01L 21/56* | (2006.01) |
| *H01L 21/683* | (2006.01) |
| *H01L 21/288* | (2006.01) |
| *H01L 25/00* | (2006.01) |
| *H01L 23/31* | (2006.01) |
| *H01L 23/48* | (2006.01) |
| *H01L 21/48* | (2006.01) |
| *H01L 21/54* | (2006.01) |
| *H01L 23/18* | (2006.01) |
| *H01L 23/538* | (2006.01) |
| *H01L 25/10* | (2006.01) |
| *H01L 23/498* | (2006.01) |

(52) U.S. Cl.
CPC .......... *H01L 21/4853* (2013.01); *H01L 21/54* (2013.01); *H01L 21/56* (2013.01); *H01L 21/565* (2013.01); *H01L 21/6835* (2013.01); *H01L 21/76885* (2013.01); *H01L 21/76895* (2013.01); *H01L 23/18* (2013.01); *H01L 23/3114* (2013.01); *H01L 23/3128* (2013.01); *H01L 23/481* (2013.01); *H01L 23/49811* (2013.01); *H01L 23/5384* (2013.01); *H01L 23/5389* (2013.01); *H01L 25/105* (2013.01); *H01L 25/50* (2013.01); *H01L 21/568* (2013.01); *H01L 23/5386* (2013.01); *H01L 2221/68359* (2013.01); *H01L 2224/16225* (2013.01); *H01L 2225/0652* (2013.01); *H01L 2225/06517* (2013.01); *H01L 2225/06548* (2013.01); *H01L 2225/06572* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC . H01L 21/54; H01L 23/5384; H01L 23/5386; H01L 25/105; H01L 21/486; H01L 23/18; H01L 2225/1035; H01L 2225/1041
See application file for complete search history.

(56) References Cited

U.S. PATENT DOCUMENTS

| | | | |
|---|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |

(56) References Cited

U.S. PATENT DOCUMENTS

| | | | |
|---|---|---|---|
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 * | 10/2001 | Beaman ............... B23K 20/004 228/180.5 |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |

(56) References Cited

U.S. PATENT DOCUMENTS

| | | |
|---|---|---|
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,605,479 B2 | 10/2009 | Mohammed |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,683,482 B2 | 3/2010 | Nishida et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 * | 4/2011 | Choi .................. H01L 23/3121 438/127 |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 3,017,437 A1 | 9/2011 | Yoo et al. |
| 3,017,452 A1 | 9/2011 | Ishihara et al. |
| 3,020,290 A1 | 9/2011 | Sheats |
| 8,012,797 B2 | 9/2011 | Shen et al. |
| 8,018,033 B2 | 9/2011 | Moriya |
| 8,018,065 B2 | 9/2011 | Lam |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |

(56) References Cited

U.S. PATENT DOCUMENTS

| | | |
|---|---|---|
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,811,055 B2 | 8/2014 | Yoon |
| 8,836,136 B2 | 9/2014 | Chau et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |

(56) References Cited

U.S. PATENT DOCUMENTS

| | | | |
|---|---|---|---|
| 9,177,832 B2 | 11/2015 | Camacho | |
| 9,196,586 B2 | 11/2015 | Chen et al. | |
| 9,196,588 B2 | 11/2015 | Leal | |
| 9,214,434 B1 | 12/2015 | Kim et al. | |
| 9,224,647 B2 | 12/2015 | Koo et al. | |
| 9,224,717 B2 | 12/2015 | Sato et al. | |
| 9,258,922 B2 | 2/2016 | Chen et al. | |
| 9,263,394 B2 | 2/2016 | Uzoh et al. | |
| 9,263,413 B2 | 2/2016 | Mohammed | |
| 9,299,670 B2 | 3/2016 | Yap et al. | |
| 9,318,452 B2 | 4/2016 | Chen et al. | |
| 9,324,696 B2 | 4/2016 | Choi et al. | |
| 9,349,706 B2 | 5/2016 | Co et al. | |
| 9,362,161 B2 | 6/2016 | Chi et al. | |
| 9,379,074 B2 | 6/2016 | Uzoh et al. | |
| 9,379,078 B2 * | 6/2016 | Yu | H01L 24/17 |
| 9,401,338 B2 | 7/2016 | Magnus et al. | |
| 9,412,661 B2 | 8/2016 | Lu et al. | |
| 9,418,940 B2 | 8/2016 | Hoshino et al. | |
| 9,418,971 B2 | 8/2016 | Chen et al. | |
| 9,437,459 B2 | 9/2016 | Carpenter et al. | |
| 9,443,797 B2 | 9/2016 | Marimuthu et al. | |
| 9,449,941 B2 | 9/2016 | Tsai et al. | |
| 9,461,025 B2 | 10/2016 | Yu et al. | |
| 9,496,152 B2 | 11/2016 | Cho et al. | |
| 9,502,390 B2 | 11/2016 | Caskey et al. | |
| 9,508,622 B2 | 11/2016 | Higgins | |
| 9,559,088 B2 | 1/2017 | Gonzalez et al. | |
| 2001/0042925 A1 | 11/2001 | Yamamoto et al. | |
| 2002/0014004 A1 | 2/2002 | Beaman et al. | |
| 2002/0125556 A1 | 9/2002 | Oh et al. | |
| 2002/0171152 A1 | 11/2002 | Miyazaki | |
| 2003/0006494 A1 | 1/2003 | Lee et al. | |
| 2003/0048108 A1 | 3/2003 | Beaman et al. | |
| 2003/0057544 A1 | 3/2003 | Nathan et al. | |
| 2003/0094666 A1 | 5/2003 | Clayton et al. | |
| 2003/0162378 A1 | 8/2003 | Mikami | |
| 2004/0041757 A1 | 3/2004 | Yang et al. | |
| 2004/0262728 A1 | 12/2004 | Sterrett et al. | |
| 2005/0017369 A1 | 1/2005 | Clayton et al. | |
| 2005/0062492 A1 | 3/2005 | Beaman et al. | |
| 2005/0082664 A1 | 4/2005 | Funaba et al. | |
| 2005/0095835 A1 | 5/2005 | Humpston et al. | |
| 2005/0173807 A1 | 8/2005 | Zhu et al. | |
| 2005/0176233 A1 | 8/2005 | Joshi et al. | |
| 2006/0087013 A1 | 4/2006 | Hsieh | |
| 2006/0255449 A1 | 11/2006 | Lee et al. | |
| 2007/0010086 A1 | 1/2007 | Hsieh | |
| 2007/0080360 A1 | 4/2007 | Mirsky et al. | |
| 2007/0190747 A1 | 8/2007 | Hup | |
| 2007/0254406 A1 | 11/2007 | Lee | |
| 2007/0271781 A9 | 11/2007 | Beaman et al. | |
| 2007/0290325 A1 | 12/2007 | Wu et al. | |
| 2008/0006942 A1 | 1/2008 | Park et al. | |
| 2008/0017968 A1 | 1/2008 | Choi et al. | |
| 2008/0023805 A1 | 1/2008 | Howard et al. | |
| 2008/0042265 A1 | 2/2008 | Merilo et al. | |
| 2008/0047741 A1 | 2/2008 | Beaman et al. | |
| 2008/0048690 A1 | 2/2008 | Beaman et al. | |
| 2008/0048691 A1 | 2/2008 | Beaman et al. | |
| 2008/0048697 A1 | 2/2008 | Beaman et al. | |
| 2008/0054434 A1 | 3/2008 | Kim | |
| 2008/0073769 A1 | 3/2008 | Wu et al. | |
| 2008/0100316 A1 | 5/2008 | Beaman et al. | |
| 2008/0100317 A1 | 5/2008 | Beaman et al. | |
| 2008/0100318 A1 | 5/2008 | Beaman et al. | |
| 2008/0100324 A1 | 5/2008 | Beaman et al. | |
| 2008/0105984 A1 | 5/2008 | Lee et al. | |
| 2008/0106281 A1 | 5/2008 | Beaman et al. | |
| 2008/0106282 A1 | 5/2008 | Beaman et al. | |
| 2008/0106283 A1 | 5/2008 | Beaman et al. | |
| 2008/0106284 A1 | 5/2008 | Beaman et al. | |
| 2008/0106285 A1 | 5/2008 | Beaman et al. | |
| 2008/0106291 A1 | 5/2008 | Beaman et al. | |
| 2008/0106872 A1 | 5/2008 | Beaman et al. | |
| 2008/0111568 A1 | 5/2008 | Beaman et al. | |
| 2008/0111569 A1 | 5/2008 | Beaman et al. | |
| 2008/0111570 A1 | 5/2008 | Beaman et al. | |
| 2008/0112144 A1 | 5/2008 | Beaman et al. | |
| 2008/0112145 A1 | 5/2008 | Beaman et al. | |
| 2008/0112146 A1 | 5/2008 | Beaman et al. | |
| 2008/0112147 A1 | 5/2008 | Beaman et al. | |
| 2008/0112148 A1 | 5/2008 | Beaman et al. | |
| 2008/0112149 A1 | 5/2008 | Beaman et al. | |
| 2008/0116912 A1 | 5/2008 | Beaman et al. | |
| 2008/0116913 A1 | 5/2008 | Beaman et al. | |
| 2008/0116914 A1 | 5/2008 | Beaman et al. | |
| 2008/0116915 A1 | 5/2008 | Beaman et al. | |
| 2008/0116916 A1 | 5/2008 | Beaman et al. | |
| 2008/0117611 A1 | 5/2008 | Beaman et al. | |
| 2008/0117612 A1 | 5/2008 | Beaman et al. | |
| 2008/0117613 A1 | 5/2008 | Beaman et al. | |
| 2008/0121879 A1 | 5/2008 | Beaman et al. | |
| 2008/0123310 A1 | 5/2008 | Beaman et al. | |
| 2008/0129319 A1 | 6/2008 | Beaman et al. | |
| 2008/0129320 A1 | 6/2008 | Beaman et al. | |
| 2008/0132094 A1 | 6/2008 | Beaman et al. | |
| 2008/0156518 A1 | 7/2008 | Honer et al. | |
| 2008/0164595 A1 | 7/2008 | Wu et al. | |
| 2008/0169548 A1 | 7/2008 | Baek | |
| 2008/0217708 A1 | 9/2008 | Reisner et al. | |
| 2008/0280393 A1 | 11/2008 | Lee et al. | |
| 2008/0284045 A1 | 11/2008 | Gerber et al. | |
| 2008/0303153 A1 | 12/2008 | Oi et al. | |
| 2008/0308305 A1 | 12/2008 | Kawabe | |
| 2009/0008796 A1 | 1/2009 | Eng et al. | |
| 2009/0014876 A1 | 1/2009 | Youn et al. | |
| 2009/0032913 A1 | 2/2009 | Haba | |
| 2009/0085185 A1 | 4/2009 | Byun et al. | |
| 2009/0091009 A1 | 4/2009 | Corisis et al. | |
| 2009/0102063 A1 | 4/2009 | Lee et al. | |
| 2009/0127686 A1 | 5/2009 | Yang et al. | |
| 2009/0128176 A1 | 5/2009 | Beaman et al. | |
| 2009/0140415 A1 | 6/2009 | Furuta | |
| 2009/0166664 A1 | 7/2009 | Park et al. | |
| 2009/0189288 A1 | 7/2009 | Beaman et al. | |
| 2009/0194829 A1 | 8/2009 | Chung et al. | |
| 2009/0256229 A1 | 10/2009 | Ishikawa et al. | |
| 2009/0315579 A1 | 12/2009 | Beaman et al. | |
| 2010/0044860 A1 | 2/2010 | Haba et al. | |
| 2010/0078795 A1 | 4/2010 | Dekker et al. | |
| 2010/0193937 A1 | 8/2010 | Nagamatsu et al. | |
| 2010/0200981 A1 | 8/2010 | Huang et al. | |
| 2010/0258955 A1 | 10/2010 | Miyagawa et al. | |
| 2010/0289142 A1 | 11/2010 | Shim et al. | |
| 2010/0314748 A1 | 12/2010 | Hsu et al. | |
| 2010/0327419 A1 | 12/2010 | Muthukumar et al. | |
| 2011/0042699 A1 | 2/2011 | Park et al. | |
| 2011/0068478 A1 | 3/2011 | Pagaila et al. | |
| 2011/0157834 A1 | 6/2011 | Wang | |
| 2012/0001336 A1 | 1/2012 | Zeng et al. | |
| 2012/0043655 A1 | 2/2012 | Khor et al. | |
| 2012/0063090 A1 | 3/2012 | Hsiao et al. | |
| 2012/0080787 A1 | 4/2012 | Shah et al. | |
| 2012/0086111 A1 | 4/2012 | Iwamoto et al. | |
| 2012/0126431 A1 | 5/2012 | Kim et al. | |
| 2012/0153444 A1 | 6/2012 | Haga et al. | |
| 2012/0184116 A1 | 7/2012 | Pawlikowski et al. | |
| 2013/0001797 A1 | 1/2013 | Choi et al. | |
| 2013/0049218 A1 | 2/2013 | Gong et al. | |
| 2013/0087915 A1 | 4/2013 | Warren et al. | |
| 2013/0153646 A1 | 6/2013 | Ho | |
| 2013/0200524 A1 | 8/2013 | Han et al. | |
| 2013/0234317 A1 | 9/2013 | Chen et al. | |
| 2013/0256847 A1 | 10/2013 | Park et al. | |
| 2013/0323409 A1 | 12/2013 | Read et al. | |
| 2013/0328178 A1 | 12/2013 | Bakalski et al. | |
| 2014/0035892 A1 | 2/2014 | Shenoy et al. | |
| 2014/0103527 A1 | 4/2014 | Marimuthu et al. | |
| 2014/0124949 A1 | 5/2014 | Paek et al. | |
| 2014/0175657 A1 | 6/2014 | Oka et al. | |
| 2014/0225248 A1 | 8/2014 | Henderson et al. | |
| 2014/0239479 A1 | 8/2014 | Start | |
| 2014/0239490 A1 | 8/2014 | Wang | |

(56) References Cited

U.S. PATENT DOCUMENTS

| | | |
|---|---|---|
| 2014/0308907 A1 | 10/2014 | Chen |
| 2014/0312503 A1 | 10/2014 | Seo |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0200566 A1 | 7/2016 | Ofner et al. |
| 2016/0225692 A1 | 8/2016 | Kim et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 2004-172157 A | 6/2004 |
| JP | 2004-200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005142378 A | 6/2005 |
| JP | 2005175019 A | 6/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 A | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 A | 2/2009 |
| JP | 2009508324 A | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 A1 | 9/2000 |
| KR | 20010061849 A | 7/2001 |
| KR | 2001-0094894 A | 11/2001 |
| KR | 20020058216 A | 7/2002 |
| KR | 20060064291 A | 6/2006 |
| KR | 10-2007-0058680 A | 6/2007 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Preliminary Report on Patentability for Appln. No. PCT/US20141055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.

(56) References Cited

OTHER PUBLICATIONS

Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010, 28 pages.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. Of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
U.S. Appl. No. 13/477,532, dated May 22, 2012.
US Office Action for U.S. Appl. No. 12/769,930, dated May 5, 2011.

3D Plus "Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
Partial Search Report—Invitation to Pay Fees for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.

\* cited by examiner

'RDL-FIRST' PACKAGED MICROELECTRONIC DEVICE FOR A PACKAGE-ON-PACKAGE DEVICE

CROSS-REFERENCE TO RELATED APPLICATION(S)

This nonprovisional application hereby claims benefit of priority to pending U.S. Provisional Patent Application Ser. No. 62/257,223, filed on 18, Nov. 2015, and to U.S. Provisional Patent Application Ser. No. 62/256,699, filed on 17 Nov. 2015, the entirety of each of which is hereby incorporated by reference herein for all purposes to the extent same is consistent herewith. The present application is related to the commonly-owned, co-pending United States nonprovisional patent application entitled "A PACKAGED MICROELECTRONIC DEVICE FOR A PACKAGE-ON-PACKAGE DEVICE", U.S. patent application Ser. No. 15/353,577, filed on even date herewith, the entire contents and disclosure of which is expressly incorporated by reference herein as if fully set forth herein for all purposes to the extent same is consistent herewith.

FIELD

The following description relates to microelectronic devices. More particularly, the following description relates to a packaged microelectronic device for a package-on-package device to provide enhanced tolerance for warping.

BACKGROUND

Package-on-package microelectronic devices conventionally include two or more packaged microelectronic devices stacked on one another. More recently, one or more of these packaged microelectronic devices is so thin as to make warpage a more significant yield and/or reliability limiting factor.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 2-1 through 2-3 are block diagrams illustratively depicting a package-on-package device including the packaged microelectronic device of FIG. 1-10 at different states of warpage.

FIGS. 3-1 through 3-3 are a progression of block diagrams illustratively depicting exemplary process flows and structures for a "redistribution layer first" formation for another packaged microelectronic device for a package-on-package device.

FIGS. 4-1 through 4-3 are a progression of block diagrams illustratively depicting exemplary process flows and structures for a "redistribution layer first" formation for yet another packaged microelectronic device for a package-on-package device.

FIG. 5 is a flow diagram illustratively depicting an exemplary "redistribution layer first" process flow for a packaged microelectronic device in accordance with any and all of FIGS. 1-1 through 4-3.

FIGS. 6-1 through 6-4B are progressions of block diagrams illustratively depicting exemplary process flows and structures for a "redistribution layer last" formation for still yet another packaged microelectronic device for a package-on-package device.

FIGS. 7-1 and 7-2 are a progression of block diagrams illustratively depicting exemplary process flows and structures for a "redistribution layer-less" formation for further yet another packaged microelectronic device for a package-on-package device.

FIG. 8 is a flow diagram illustratively depicting an exemplary "redistribution layer last" and "redistribution layer-less" process flow for a packaged microelectronic device in accordance with any and all of FIGS. 6-1 through 7-2.

DETAILED DESCRIPTION

Figure 1:
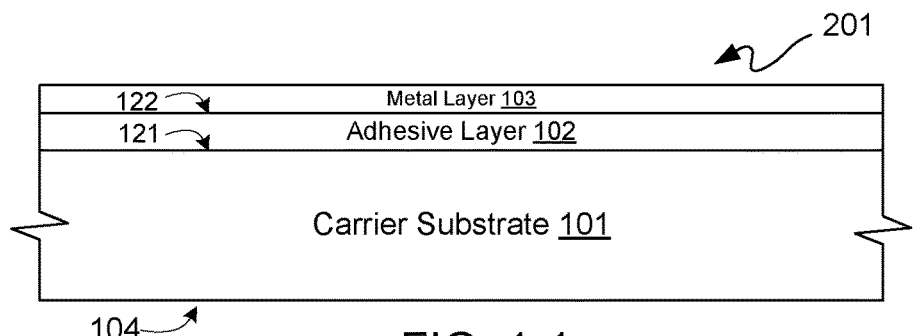
FIGS. 1-1 through 1-10 are a progression of block diagrams illustratively depicting exemplary process flows and structures for a "redistribution layer first" formation of a packaged microelectronic device.

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

The following description includes description of package-on-package microelectronic devices ("PoPs"). Along those lines, one microelectronic package of a PoP may be configured to accommodate warpage of another microelectronic package. Optionally, microelectronic packages of a PoP may be configured to accommodate warpage between directly coupled microelectronic packages of a PoP.

Some microelectronic packages are presently in a range of approximately 150 to 400 microns thick (0.150 to 0.400 millimeters (mm) thick), for a microelectronic package in total height, excluding solder ball or other external interconnects. Overall height of a PoP is presently conventionally approximately 800 to 1200 microns (0.800 to 1.200 mm). As one or more microelectronic packages in a PoP may be in a range of approximately 150 to 400 microns thick, likelihood of warping of such one or microelectronic packages may be higher than if such one or more microelectronic packages were thicker than 400 microns.

As described below in additional detail, one or more interconnect structures are provided with protruding ends ("protrusions") above a molding or encapsulation surface of one or more of such microelectronic packages of a PoP. Heights of these protrusions allow for more surface area in a vertical or z-axis direction. However, height of these protrusions is limited by an overall height allowance of such PoPs.

Microelectronic packages of a PoP directly coupled to one another warp away one from the other. Furthermore, directly coupled microelectronic packages of a PoP may both warp in opposing directions away from one another. However, surface area of such protrusions may allow solder masses or other electrically conductive eutectic bonding masses ("bonding masses") to more readily stay adhered in the presence of such warpage. Increased surface area provided by such protrusions to which such bonding masses are attached at least in part may allow for an increase in allowable warpage. Whether either or both microelectronic packages directly coupled to one another warp, height of protrusions therebetween in excess of convention allows for an increased tolerance for such warpage.

Along those lines, a method relates generally to forming a packaged microelectronic device. In such a method, at least one redistribution layer is formed having an inner region and an outer region outside the inner region. The forming of the at least one redistribution layer includes forming first interconnect pads in both the inner region and the outer region on a lower surface and second interconnect pads in the outer region on an upper surface of the at least one redistribution layer. Interconnect structures are formed on and extend away from corresponding upper surfaces of the second interconnect pads in the outer region. A microelectronic device is coupled to an upper surface of the at least one redistribution layer in the inner region. A dielectric layer is formed to surround at least portions of shafts of the interconnect structures. The interconnect structures have upper ends thereof protruding above an upper surface of the dielectric layer a distance to increase a warpage limit for a combination of at least the packaged microelectronic device and one other packaged microelectronic device directly coupled to protrusions of the interconnect structures.

An apparatus relates generally to a packaged microelectronic device. In such a packaged microelectronic device, at least one redistribution layer has an inner region and an outer region outside the inner region. The at least one redistribution layer includes first interconnect pads in both the inner region and the outer region on a lower surface and second interconnect pads in the outer region on an upper surface of the at least one redistribution layer. Interconnect structures are on and extend away from corresponding upper surfaces of the second interconnect pads in the outer region. A microelectronic device is coupled to an upper surface of the at least one redistribution layer in the inner region. A dielectric layer surrounds at least portions of shafts of the interconnect structures. The interconnect structures have upper ends thereof protruding above an upper surface of the dielectric layer a distance to increase a warpage limit for a combination of at least the packaged microelectronic device and one other packaged microelectronic device directly coupled to protrusions of the interconnect structures.

Another method relates generally to forming a packaged microelectronic device. In such other method, interconnect structures are formed in an outer region of the packaged microelectronic device. A microelectronic device is coupled in an inner region of the packaged microelectronic device inside the outer region. A dielectric layer is formed to surround at least portions of shafts of the interconnect structures and along sides of the microelectronic device. The interconnect structures have first ends thereof protruding above an upper surface of the dielectric layer a distance to increase a warpage limit for a combination of at least the packaged microelectronic device and one other packaged microelectronic device directly coupled to protrusions of the interconnect structures.

Another apparatus relates generally to another packaged microelectronic device. In such other packaged microelectronic device, interconnect structures are in an outer region of the packaged microelectronic device. A microelectronic device is coupled in an inner region of the packaged microelectronic device inside the outer region. A dielectric layer surrounds at least portions of shafts of the interconnect structures and along sides of the microelectronic device. The interconnect structures have first ends thereof protruding above an upper surface of the dielectric layer a distance to increase a warpage limit for a combination of at least the packaged microelectronic device and one other packaged microelectronic device directly coupled to protrusions of the interconnect structures.

Other features will be recognized from consideration of the remainder of the Detailed Description and Claims, which follow.

RDL First Examples With "Straight" Interconnect Structures

FIGS. 1-1 through 1-10 are a progression of block diagrams illustratively depicting exemplary process flows and structures for a packaged microelectronic device ("packaged device") 100. With simultaneous reference to FIGS. 1-1 through 1-10, formation of a packaged device 100 is further described.

At 201, a carrier substrate 101 may be obtained having an upper surface 121 and a lower surface 104 opposite upper surface 121. Carrier substrate 101 may be any support platform, including without limitation a carrier wafer, used to provide temporary support for formation of a plurality of substrate assemblies thereon, including a plurality of packaged devices 100 even though formation of a single packaged device 100 is illustratively depicted for purposes of clarity and not limitation.

An adhesive layer 102, such as an adhesive tape or other adhesive layer, may optionally be formed, put upon or otherwise adhered to an upper surface 121 of carrier substrate 101 in direct contact therewith.

A metal layer 103, such as a metal foil including without limitation a copper foil, may be formed, put on or otherwise applied to an upper surface 122 of adhesive layer 102 in direct contact therewith. If optional adhesive layer 102 is not used, then metal layer 103 may be placed on upper surface 121 of carrier substrate 101 in direct contact therewith.

At 202, metal layer 103 may be patterned to form conductive pads 103. Formation of conductive pads 103 may be by masking, lithographic patterning and metal etching, direct write e-beam or laser patterning, or other suitable means for removing a part of metal layer 103 to form electrically conductive interconnect pads ("conductive pads") 103.

Conductive pads 103 may generally be located in either of two regions, an inner region 104 or an outer region 129. Outer region 129 may generally be thought of as a peripheral layout region, and inner region 104 may generally be thought of as an area array layout region.

Formation of conductive pads 103 may be considered an initial metal layer for formation of a redistribution layer ("RDL") 107. Conductive pads 103 may in whole or in part form an area array layout. Optionally, a dielectric layer may be used, and such dielectric layer may be patterned at 202 to form recesses for conductive pads 103 followed by deposition of a metal layer 103 including into such recesses followed by etching, polishing or grinding back for providing conductive pads 103.

At 203, one or more dielectric layers, such as one or more spin coat layers, may be used to form at least one dielectric layer 118 for a redistribution layer 107. As is known, a redistribution layer 107 may include one or more dielectric layers and one or more metal layers.

Dielectric layer 118 may be patterned to form recesses associated with conductive pads, illustratively depicted as recesses 156. A metal layer 119 may be conformally deposited onto an upper surface of such patterned dielectric layer 118.

At 204, such metal layer 119 may be polished or ground down to dielectric layer 118 to in effect provide electrically conductive vias ("vias") 119V to conductive pads 103. Optionally, pad level electrically conductive traces ("traces") 119T may be provided with metal layer 119. Optionally, recesses for surface traces may be formed in an upper surface of dielectric layer 118 for conformal deposition of metal layer 119 therein to form traces 119T, which may or may not be interconnected to vias 119V for electrical conductivity.

At 205, a capping dielectric layer 105 may be deposited to fill recesses formed, such as for forming vias 119V for example, for redistribution layer 107. Such capping dielectric layer 105 may be polished or ground back to provide an upper surface 123.

At 206, interconnect pads 108 of a redistribution layer 107 may be formed, such as in any of the above-described ways of forming conductive pads 103, on upper surface 123. Interconnect pads 108 in this example are formed only in outer region 129. In contrast, conductive pads 103 in this example are formed in both inner region 104 and outer region 129.

Optionally, a lower redistribution layer 107-1 may be formed followed by optional formation of an upper redistribution layer 107-2 interconnected to redistribution layer 107-1. However, for purposes of clarity by way of example and not limitation, it shall be assumed that a single redistribution layer 107 is used in this example.

Before or after formation of interconnect pads 108, at 207A contacts 111, which may include electrically conductive solder or other eutectic masses, may be formed or put in an inner region 104 on an upper surface 123 of dielectric layer 105. Contacts 111 may be for interconnection of an integrated circuit microelectronic device ("microelectronic device") 109.

Microelectronic device 109 may be positioned in inner region 104 in a "face-down" orientation for interconnection through contacts 111 with vias 119V and/or traces 119T. In an example, microelectronic device 109 may be an active device, such as for example an active area array microelectronic device. In another example, microelectronic device 109 may be a passive device, such as for example a passive area array microelectronic device. In yet another example, microelectronic device 109 may include an interposer having one or more integrated circuit dies coupled thereto. In still yet another example, microelectronic device 109 may include one or more stacks of integrated circuit dies.

Microelectronic device 109 may be a bare or packaged device. In an example, microelectronic device 109 may optionally include a backside redistribution layer 199. Backside redistribution layer 199 may or may not be interconnected internally within microelectronic device 109 to one or more active devices, such as an integrated circuit die component of microelectronic device 109. Such integrated backside redistribution layer 199 may for example be a passive device for routing of signals and/or voltages.

Optionally at 207B, before or after formation of interconnect pads 108, at 207B an adhesive layer 128, such as for a die attach pad for example, may be formed or positioned in an inner region 104 on an upper surface 123 of dielectric layer 105 for interconnection of microelectronic device 109. Microelectronic device 109 may be positioned in a "face-up" or a "face-down" orientation for attachment to an upper surface 123 of dielectric layer 105 through use of adhesive layer 128. For purposes of clarity by way of example and not limitation, a face-down orientation of microelectronic device 109 is further described.

At 208, interconnect structures 115 may be formed on and extending away from corresponding upper surfaces 124 of interconnect pads 108 in outer region 129. Generally, in this example interconnect structures 115 are "straight", namely there is no intentional bend in interconnect structures 115 in this example. In an example, interconnect structures 115 can be formed as wire bond wires or other extruded electrical conductor bonded to upper surfaces 124.

In another example, interconnect structures 115 may be formed as plated wires. Plated wires may be formed including depositing a resist, masking and patterning such resist, removing portions of such resist to form holes with corresponding upper surfaces 124 as bottom surfaces respectively thereof. Such holes may be plated with one or more layers of material, including at least one electrically conductive material. Generally, solid or hollow metal posts may be formed in part by plating. In another example, metal coated dielectric posts may be formed.

Interconnect structures 115 implemented as wire bond wires may have a thickness 114 in a range of approximately 15 to 45 microns. Interconnect structures implemented as plated posts may have a thickness 114 in a range of approximately 1 to 45 microns.

In another example, additional surface area for plated posts may be formed by optionally forming contact pads 198. Contact pads 198 may be formed same or similar to plated posts, as bases of protrusions 220. However, for purposes of clarity by way of example and not limitation, it shall be assumed that optional contact pads 198 are not formed in this example.

Generally, interconnect structures 115 may be formed by dipping, transferring, depositing, placing, or a combination thereof, to form pins, posts, pillars, leads, wires, or other similar structures having a vertical orientation which may or may not be perpendicular to upper surfaces of corresponding interconnect pads 108.

Interconnect structures 115 may be solid or hollow, fully or partially electrically conductive, and/or supported partially by a semiconductor or dielectric material. For purposes of clarity by way of example and not limitation, an example with plating-formed posts for interconnect structures 115 is further described.

At 209, optionally with formation of interconnect structures 115 at 208, interconnect structures 116 may simultaneously be formed though extending away from an upper surface 129 of a microelectronic device 109. In an example, interconnect structures 116 may be interconnected to through-silicon-vias (not shown) of microelectronic device 109. Optionally, interconnect structures 116 may be formed in separate operations than interconnect structures 115.

For an optional backside redistribution layer 199 included with microelectronic device 109, a fan-in or fan-out pitch may be used by interconnect structures 116 for interconnection with such backside redistribution layer 199. Optionally, microelectronic device 109 may include a front side redistribution layer or interposer 197 for a fan-in or fan-out pitch for coupling to contacts 111. Optionally, both optional redistribution layers 197 and 199 may be included in microelectronic device 109.

Assuming no TSVs in microelectronic device 109, optional backside redistribution layer 199 may not be internally interconnected within microelectronic device 109 to an IC die thereof for signaling. However, a front side redistribution layer 197 may be internally interconnected within microelectronic device 199 to an IC die thereof for signaling.

Optionally, interconnect structures 115 may be straight but slanted or tilted, as generally indicated with dashed line 196, to increase pitch. For purposes of clarity by way of example and not limitation, it shall be assumed that optional redistribution layers 197 and 199 are not included in microelectronic device 109 and that interconnect structures 115 are not slanted.

For purposes of clarity by way of example and not limitation, an example of plating-formed posts for interconnect structures 116 is further described. Generally, solid or hollow metal posts may be formed in part by plating. In another example, metal coated dielectric posts may be formed. In yet another example, interconnect structures 116 may be wire bond wires or one or more of the other examples for interconnect structures 115. Optionally, a combination of two or more different forms of interconnect structures 115 and/or 116 may be implemented.

Interconnect structures 115 may be used to increase a warpage limit with respect to outer region 129. Inner interconnect structures 116 may be used to increase a warpage limit with respect to inner region 104.

At 210, a dielectric layer 117 may be formed surrounding at least portions of shafts 115S of interconnect structures 115 and along sides 167 of and over and on an upper surface 168 of microelectronic device 109. Optionally, dielectric layer 117 may be formed surrounding at least portions of shafts 116S of interconnect structures 116.

Interconnect structures 115 and/or 116 may respectively have corresponding upper ends 115E and/or 116E, as well as corresponding portions of shafts 115S and/or 116S, protruding above an upper surface 126 of dielectric layer 117. Interconnect structures 115 and/or 116 may protrude a distance of protrusion height 137 to provide protrusions 220 for at least some if not all of interconnect structures 115 and/or 116. Protrusions 220 may have portions of shafts 115S and 116S for providing wicking lengths for adherence of solder or other electrically conductive bonding masses 131 at 211.

Protrusions 220 may increase a warpage limit for a combination of a packaged device 100 with another packaged device directly coupled to upper ends 115E and 116E respectively of corresponding interconnect structures 115 and/or 116 with bonding masses 131. While some numerical examples of heights for protrusions 220 are provided herein, generally protrusion height 137 is at least 30% of a distance 112 of separation between an upper surface 126 of packaged device 100 and a lower surface 120 of a package device 130.

Dielectric layer 117 may be injection molded with a mold assist film to leave protrusions 220 out of molding material to form an upper surface 126 of dielectric layer 117 below upper ends 115E and/or 116E by a distance or protrusion height 137. Optionally, dielectric layer 117 may be formed by an encapsulant, molding or composite material, which may be molded, potted, spun on, laminated, screen printed, applied, or otherwise suitably formed. If upper ends 115E and/or 116E are covered by a material used to form dielectric layer 117, subsequent polishing, grinding, and/or etching back may be used to reveal protrusions 220.

Protrusions 220 may have portions of shafts 115S at least temporarily exposed for wettable surfaces by an electrically conductive bonding material.

Figures 1, 2:
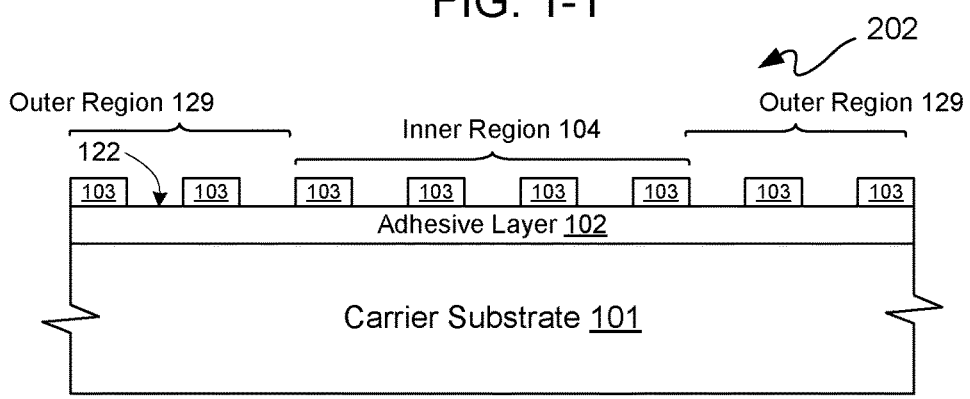
Figures 1, 2, 3:
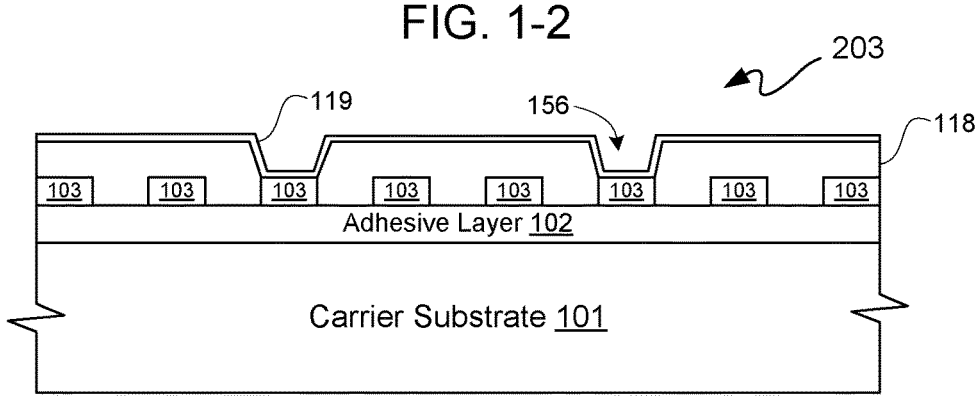

With additional reference to FIGS. 2-1 through 2-3, formation of a PoP 139 is described.

At 211, packaged device 100 may be singulated from carrier substrate 101. Carrier substrate 101 and adhesive layer 102 may be removed from packaged device 100.

Further, at 211 another package device 130 may be directly coupled to upper ends 115E and/or 116E and/or at least portions of shafts 115S and/or 116S of protrusions 220 with solder balls or other electrically conductive bonding masses 131 to provide a PoP 139. Bonding masses 131 may be deposited or otherwise formed over upper ends 115E and/or 116E as well as along at least portions of shafts 115S and/or 116S of protrusions 220.

Protrusion height 137 for wicking of bonding masses 131 may be in a range above a conventional height of micro pillars on pads for a PoP, which conventional height is generally in a range of approximately 30 to 40 microns. Protrusion height 137 may be in a range of approximately 75 to 120 microns or more. In other words, protrusion height 137 may be more than double the height of conventional micro pillars.

Generally height of bonding masses 131 is at least approximately 200 to 250 microns after collapse for approximately a 300 to 400 micron pitch of such bonding masses. Thus no additional height need be added by protrusions 220, as the entire length of protrusions 220 may be covered by bonding masses 131. In other words, protrusion height 137 is less than overall height of bonding masses 131, and so protrusions 220 may be used without adding to height or thickness of PoP 139.

Solder balls or other electrically conductive bonding masses 155 may be attached to corresponding undersides of conductive pads 103, which are exposed after removal of carrier substrate 101, as well as possibly optional adhesive layer 102. In another example, electrically conductive bonding masses 155 may be for a surface mount interconnection.

In this example, packaged device 130 is of a different configuration than packaged device 100. However, in another example packaged device 130 may have a same general configuration as packaged device 100.

In this example configuration of packaged device 130, packaged device 130 includes an interposer 133 having conductive routings 134 interconnected to an integrated circuit die 132 with under bump metalization 135. A molding/encapsulating layer 136 of packaged device 130 may be used to cover integrated circuit die 132.

Packaged device 130 may have a packaged device height or thickness 158 from an upper surface of molding/encapsulating layer 136 to upper ends 115E and 116E, namely including a portion, if any, of the thickness of bonding masses 131 trapped between upper ends 115E or 116E and a lower surface of interposer 133. packaged device height or thickness 158 for in such example may be in a range of approximately 800 to 1200 microns. Generally, packaged device 130 at least as thick as 800 microns is not as susceptible to warping as packaged device 100.

Packaged device 100 may have an overall height or thickness 157 from upper ends 115E and 116E to bottom surface 122 of redistribution layer 107, namely excluding bonding masses 155. A packaged device 100 may have a "body" thickness in a range of approximately 150 to 400 microns, excluding heights of conductive bonding masses 155 and protrusions 220. Assuming bonding masses 155 have a height in a range of approximately 300 to 400 microns, total height or thickness 159 of PoP 139 may thus be in a range of approximately 1350 (i.e., 800+150+100+ 300) microns to 2120 (i.e., 1200+400+120+400) microns.

For purposes of clarity by way of example and not limitation, assuming no warpage in packaged devices 100 and 130 in FIG. 2-1, PoP 139 of FIG. 2-1 may be in a state of no warpage and thus may be a reference for determining a warpage measurement 138. Warpage measurement 138 (illustratively depicted in FIGS. 2-2 and 2-3) may be for a greatest amount of warpage.

With reference to FIG. 2-2 for purposes of clarity by way of non-limiting example, packaged device 100 may be turned up at either or both ends with reference to packaged device 130, assuming packaged device 130 has no warpage for purposes of a reference. With reference to FIG. 2-3 for purposes of clarity by way of non-limiting example, packaged device 100 may be bowed upward in a middle section thereof with reference to packaged device 130, assuming packaged device 130 has no warpage for purposes of a reference.

In either of these examples, a warpage measurement 138 may be obtained. This warpage measurement 138 may be a bounded parameter to a maximum warpage of approximately 60 (i.e., 100–40) to 90 (i.e., 120–30) microns in excess of a conventional limit therefor due to use of protrusions 220. In other words, bonded masses 131 may be within tolerance for reliably maintaining a direct coupling of packaged device 100 and 130 one to another even with a warpage in excess of a conventional limit therefor.

For purposes of clarity by way of non-limiting example, if height of protrusions is 100 microns and warpage tolerance without such additional protrusion heights is 100 microns with 40 micron high micro pillars, then overall warpage tolerance may be increased to approximately 160 microns by use of protrusions as described herein. This is just one example, and other values may be used in accordance with the description herein.

By increasing tolerance for warpage between two packaged devices with no increase in overall height, yield and/or product reliability of PoPs may be increased. Additionally, if protrusions 220 do not include optional contact pads 198, then surface area for wicked adherence of bonding masses 131 may be limited to upper ends 115E and at least portions of shafts 115S of protrusions 220 for interconnect structures 115 for example. Thus, contact area reliability and warpage tolerance height are both dependent on protrusions 220. In contrast to conventional micro pillars, which use a pad to provide sufficient contact surface area for reliable adherence, protrusions 220 do not necessarily require use of a pad for contact area.

If, however, optional contact pads 198 are implemented, then surface areas for contact with bonding masses 131 may be substantially provided by such contact pads 198 in comparison with surface areas of protrusions 220. In this example, warpage tolerance height may be based primarily on protrusions 220. In other words, if optional contact pads 198 are used, then shorter protrusions 220 may be used. However, less warpage tolerance may be provided by use of shorter protrusions 220 in comparison to taller protrusions 220.

RDL First Examples with "Bent" Interconnect Structures

FIGS. 3-1 through 3-3 are a progression of block diagrams illustratively depicting exemplary process flows and structures for other examples of packaged device 100. FIG. 3-1 continues after FIG. 1-7B, and so the previous description is not repeated for purposes of clarity and not limitation.

Again, a face-down orientation for microelectronic device 109 is assumed for purposes of clarity and not limitation. Optional interconnect structures 116 whether intentionally straight and/or intentionally bent to have lateral sections may be implemented in accordance with the description herein. For these examples, it is assumed that optional interconnect structures 116 are not implemented.

With simultaneous reference to FIGS. 1-1 through 3-3, such exemplary process flows and structures for other examples of packaged device 100 are further described.

At 221, one or more bent interconnect structures 115 are formed with lateral sections 115L. Interconnect structures 115 in previously described examples were intentionally straight. For FIGS. 3-1 through 3-3, one or more of interconnect structures 115 may be intentionally formed with one or more bends 160 at one or more ends of lateral sections 115L of such interconnect structures 115.

Bases 115B of bent interconnect structures 115 may be ball, stitch or otherwise bonded to upper surfaces 124 of corresponding interconnect pads 108. A wire bond forming tool (not shown) may be used to extend bases 115B vertically away from upper surfaces 124 and then bend wire bond wires, right or left, to initiate a bend 160 at an end of a lateral section 115L within a shaft 115S of such a bent interconnect structure 115. Lateral sections 115L may be bent at an acute angle 161 with reference to a horizontal plane of an upper or lower surface of a redistribution layer 107.

Optionally, a portion of a lateral section 115L may overlap an upper surface 125 of microelectronic device 109, as illustratively indicated with a dashed line. Optionally, a portion of a lateral section 115L of a bent interconnect structure 115 may overlap a portion of an adjacent neighboring interconnect pad 108, as illustratively indicated with a dashed line. Optionally, a portion of a lateral section 115L of a bent interconnect structure 115 may overlap a portion of an adjacent neighboring bent interconnect structure 115, as illustratively indicated with a dashed line.

Pitch P1 between bases 115B of adjacent neighboring interconnect structures 115, including at least one bent interconnect structure 115 thereof, may be substantially narrower than pitch P2 between upper ends 115E of such adjacent neighboring interconnect structures 115. Along those lines, there may be more area for wider pitches by extending one or more upper ends 115E of interconnect structures from outer region 129 into inner region 104. Wider pitch P2 may be used to fan-out or fan-in signals and/or voltages from and/or to microelectronic device 109.

At 222, a dielectric layer 117 may be formed surrounding at least portions of shafts 115S of interconnect structures 115, as previously described. Interconnect structures 115 may have corresponding upper ends 115E, as well as corresponding portions of shafts 115S and/or 116S, protrude above an upper surface 126 of dielectric layer 117 a distance or height 137. Interconnect structures 115 may protrude a distance of protrusion height 137 to provide protrusions 220 for at least some if not all of straight and/or bent interconnect structures 115.

Protrusions 220 may increase a warpage limit for a combination of a packaged device 100 with one other packaged device directly coupled to upper ends 115E of corresponding bent and/or straight interconnect structures 115 with bonding masses 131. Protrusions 220 may be straight, whether perpendicular or not with respect to upper surface 126.

Upper ends 115E of protrusions 220 of bent interconnect structures 115 may be are laterally displaced a distance 224 with respect to corresponding bases 115B of such bent interconnect structures. Bent, slanted, and/or straight interconnect structures 115 may all have a same protrusion height 137.

Prior to attachment of upper ends 115E at least some, if not all, of bent interconnect structures 115 have cantilevered portions of shafts 115S. Cantilevered portions of shafts 115S may correspond to upper ends 115E and may be strait for interconnection with a packaged device 130.

At least some of bent interconnect structures 115 are wire bond wires bonded to upper surfaces 124 of interconnect pads 108 with cantilevered shafts being bonding tool formed. Optionally, a portion of such at least some of bent interconnect structures 115 may have cantilevered portions of shafts 115S extending over upper surface 125 of a microelectronic device 109. Again, microelectronic device 109 may be an area array microelectronic device.

Optionally, at least some of interconnect structures 115 may have different pitches as between ends 115E and bases 115B thereof. Optionally, at least some of interconnect structures 115 may be shaped leads.

At 223, packaged device 100 may be singulated from carrier substrate 101. Carrier substrate 101 and adhesive layer 102 may be removed from packaged device 100 as previously described for operations at 211.

At 223, another package device 130 may be directly coupled to upper ends 115E, and/or 116E, and at least portions of shafts 115S, and/or 116S, of protrusions 220 as previously described with reference to operations at 211. Bonding masses 131 may be deposited or otherwise formed as previously described.

Protrusion height 137 may be as previously described. Bonding masses 131 may be as previously described, so as to not add any additional height or thickness to PoP 139.

Solder balls or other electrically conductive bonding masses 155 may be attached as previously described. Packaged device 130 may be as previously described. Packaged device 100 may be as previously described with respect to an overall height or thickness 157 from upper ends 115E and 116E to bottom surface 122 of redistribution layer 107, namely excluding bonding masses 155.

Figures 1, 2, 3, 4:
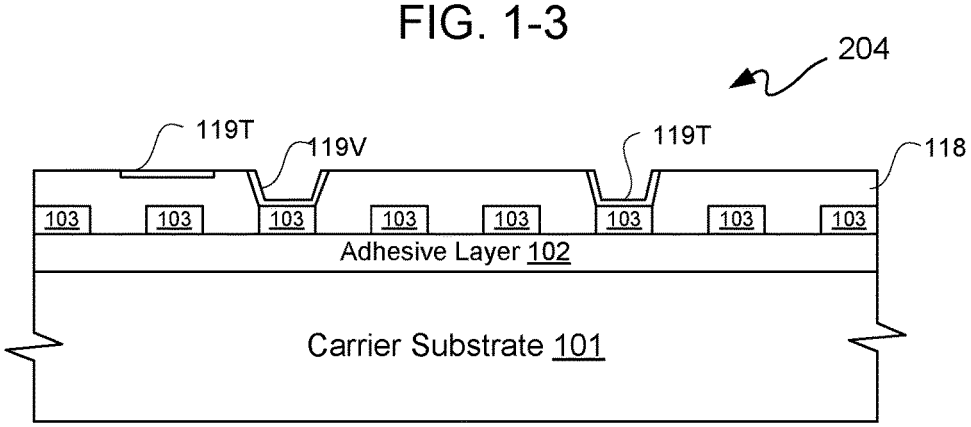

FIGS. 4-1 through 4-3 are a progression of block diagrams illustratively depicting exemplary process flows and structures for still other examples of packaged device 100. FIG. 4-1 continues after FIG. 1-8 or optionally FIG. 1-9, and so the previous description is not repeated for purposes of clarity and not limitation.

At 231, a stiffening or other reinforcing layer ("reinforcing layer") 127 may be dispensed, deposited, spun on, or otherwise used to coat an in-process packaged device 100. Reinforcing layer 127 may be a stiffener material. Reinforcing layer 127 may be deposited as a wicking layer to exposed surfaces of an in-process packaged device 100. Reinforcing layer 127 may be used prior to formation of dielectric layer 117 to be beneath dielectric layer 117. Stiffener material may adhere to exterior surfaces, including in at least in part exterior surfaces of interconnect structures 115. Stiffener material may adhere to at least sides of microelectronic device 109.

Reinforcing layer 127 may be a dielectric composition stiffener material which wets exterior surfaces, including exterior surfaces of shafts 115S of interconnect structures 115. Such a stiffener material may be a viscous material. Along those lines, reinforcing layer 127 may wick-up sides of shafts 115S of interconnect structures 115. For example, a stiffener material may be an epoxy or other suitable polymeric material.

Optionally, at 231 an etch back 234 may be used to remove upper residual stiffener material on sides of protrusions 220, including upper ends 115E.

At 232, a dielectric layer 117 may be formed surrounding at least remaining portions of shafts 115S of interconnect structures 115. Optionally, dielectric layer 117 may be formed surrounding at least remaining portions of shafts 116S of interconnect structures 116. The remainder of the above-description of formation of dielectric layer 117 and other description for any and all operations at 232 is the same as at 210, and thus is not repeated.

At 233, packaged device 100 may be singulated from carrier substrate 101. Carrier substrate 101 and adhesive layer 102 may be removed from packaged device 100 as previously described for operations at 211.

At 233 another package device 130 may be directly coupled to upper ends 115E, and/or 116E, and at least portions of shafts 115S, and/or 116S, of protrusions 220, as previously described for operations at 211.

Protrusion height 137 may be as previously described. Bonding masses 131 may be as previously described, so as to not add any additional height or thickness to PoP 139.

Solder balls or other electrically conductive bonding masses 155 may be attached as previously described. Packaged device 130 may be as previously described. Packaged device 100 may be as previously described with respect to an overall height or thickness 157 from upper ends 115E and 116E to bottom surface 122 of redistribution layer 107, namely excluding bonding masses 155.

Figures 1, 2, 3, 4, 5:
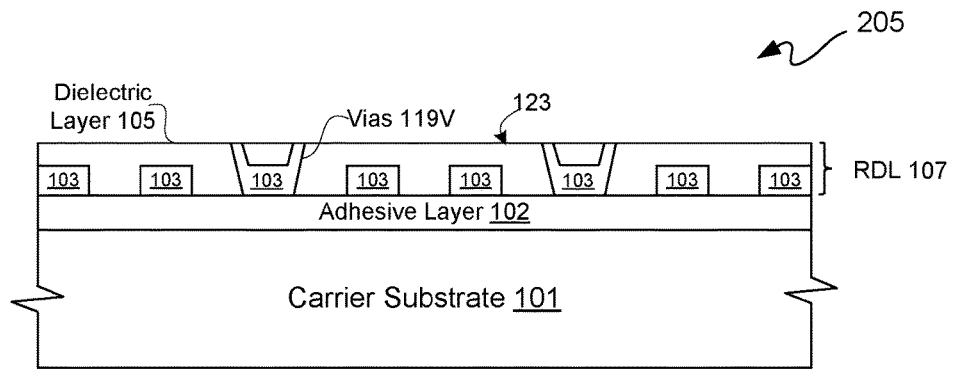

With reference to FIG. 5, a flow diagram illustrative depicts an exemplary "redistribution layer first" process flow ("process flow") 140 for a packaged device 100. Process flow 140 follows from one or more of the above-described operations, and thus is a general recapitulation thereof for purposes of clarity and not limitation.

At 141, at least one redistribution layer 107 having an inner region and an outer region outside the inner region is formed. Such forming of at least one redistribution layer 107 may include forming first interconnect pads 103 in both the inner region and the outer region at a lower surface and second interconnect pads 108 in the outer region at an upper surface of at least one redistribution layer 107. Formation at 141 may include at least some of operations 151 through 154.

At 151, a carrier substrate having an upper surface and a lower surface opposite the upper surface is obtained. At 152, an adhesive layer 102 is optionally adhered to the upper surface of carrier substrate 101. At 153, a metal layer 103 is applied to either an upper surface of adhesive layer 102 or the upper surface of carrier substrate 101. At 154, first interconnect pads 103 are patterned out of metal layer 103. Patterning at 154 may include forming an area array layout for a subset of first interconnect pads 103 in the inner region.

After 141, at 142 interconnect structures 115 are formed directly or indirectly on and extend away from corresponding upper surfaces of the second interconnect pads in the outer region. At 143, a microelectronic device 109 is coupled to an upper surface of at least one redistribution layer 107 in the inner region.

Optionally at 144, a stiffening layer 127 may be formed with a stiffener material. Optionally, at 145, residual portions of the stiffener material at upper ends of interconnect structures 115 are etched back.

At 146, a dielectric layer 117 is formed surrounding at least portions of shafts of interconnect structures 115. At 147, optionally residual portions of dielectric layer 117 at the upper ends of interconnect structures 115 are etched back.

At this juncture, interconnect structures 115 have upper ends protruding above an upper surface of dielectric layer 117 a distance to increase a warpage limit. Increased warpage limit is for a combination of at least packaged device 100 and one other packaged device 130 directly coupled to protrusions 220 of interconnect structures 115.

At 148, a packaged device 100 may be singulated from carrier substrate 101. At 149, carrier substrate 101 and adhesive layer 102 can be removed from packaged device 100. For forming a PoP 139, optionally at 150 another packaged device 130 is coupled to the upper ends of interconnect structures 115 with electrically conductive bonding masses 131 to provide a PoP 139.

Figures 1, 2, 3, 4, 5, 6:
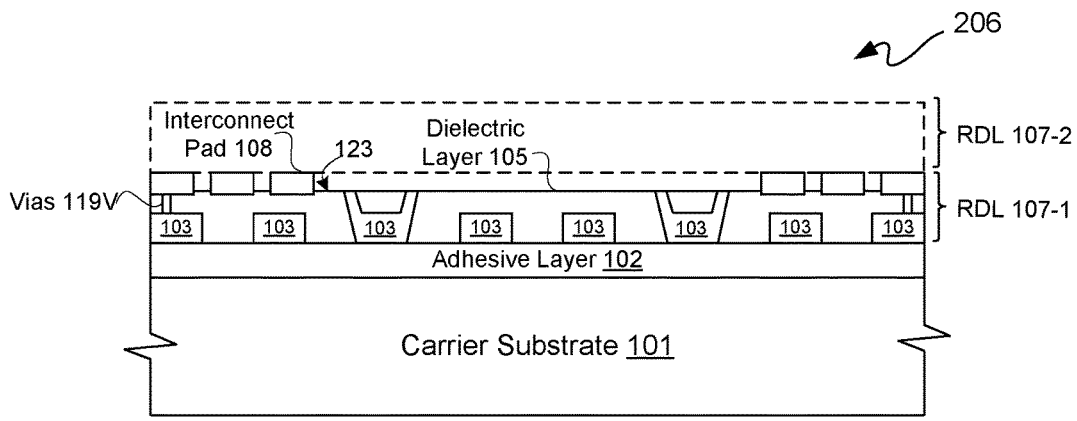

"RDL Last" or "RDL-less" Examples with "Straight" and/or "Bent" Interconnect Structures With reference to FIG. 6-1, at 241 a carrier substrate 101 having an upper surface 171 and a lower surface opposite thereof has formed on an upper surface 171 thereof a metal layer 179. As many features of the following description have been previously described, though in different sequences, multiple operations are combined at 241 for purposes of clarity and not limitation.

Optionally, metal layer 179 may be patterned to form interconnect pads 108 in outer region 129 and a heat spreader 176 in inner region 104. For purposes of clarity and not limitation, it shall be assumed that interconnect pads 108 and heat spreader 176 are not formed of metal layer 179.

A same metal layer 179, or optionally another metal layer 177, may be formed. For purposes of clarity by way of example and not limitation, it shall be assumed that another metal layer 177 is formed on an upper surface 172 of metal layer 179. In this example, metal layer 179 is a sacrificial metal layer.

Metal layer 177 may be patterned on metal layer 179 to form interconnect pads 108 in outer region 129. Metal layer 177 may be at least essentially removed from inner region 104.

An adhesive or die pad layer 162 may be deposited or otherwise adhered to an upper surface 172 of metal layer 179 in inner region 104. An upper surface 173 of adhesive layer 162 may be above or taller than an upper surface 174 of interconnect pads 108. In an example, adhesive layer 162 is an adhesive tape.

At 241 "straight" interconnect structures 115 and/or "bent" interconnect structures 115, as indicated in a dashed line, may be formed in an outer region 129 for a packaged device 100. Interconnect structures 115 may for example be plated posts or wire bond wires with same or different pitches, as previously described. For purposes of clarity and not limitation, it shall be assumed that "straight" interconnect structures 115 are formed at 241.

Still at 241, a microelectronic device 109 may be coupled in a face-up orientation to upper surface 173 of adhesive layer 162 in an inner region 104 of packaged device 100 inside outer region 129. In another example, microelectronic device 109 may be coupled in a face-down orientation.

In this example, microelectronic device 109 is pre-bumped with bumps 175. In another example, microelectronic device 109 may not be pre-bumped with bumps 175. However, in this example, a front-side surface of microelectronic device 109 has bumps 175 residing thereon.

Continuing at 241, a dielectric layer 117 may be formed surrounding at least portions of shafts 115S of interconnect structures 115 and along sides of microelectronic device 109. Optionally, prior to formation of dielectric layer 117, a reinforcing layer 127 may be formed as previously described including wicking along sides of microelectronic device 109.

At 241, a polishing or grinding operation 163 may be used to remove a portion of dielectric layer 117 down to upper surfaces 164 of bumps 175 and upper ends 115E of interconnect structures 115, namely upper surface 165 of dielectric layer 117. Optionally, an etch back operation may be used for such removal of a portion of dielectric layer 117. Optionally, a mold assist film may be used to form dielectric layer 117 below bumps 175 and upper ends 115E.

With reference to FIG. 6-2, at 242, at least one redistribution layer 107 may be formed over upper ends 115E of interconnect structures 115 and over bumps of microelectronic device 109. At a lower surface of such at least one redistribution layer 107, traces 166 and/or vias 119V may be formed for interconnection of one or more bumps 175 to one or more interconnect structures 115. Formation of at least one redistribution layer 107 may include formation of upper interconnect pads 103 in both inner region 104 and outer region 129 along an upper surface of such at least one redistribution layer 107.

Figures 1, 6:
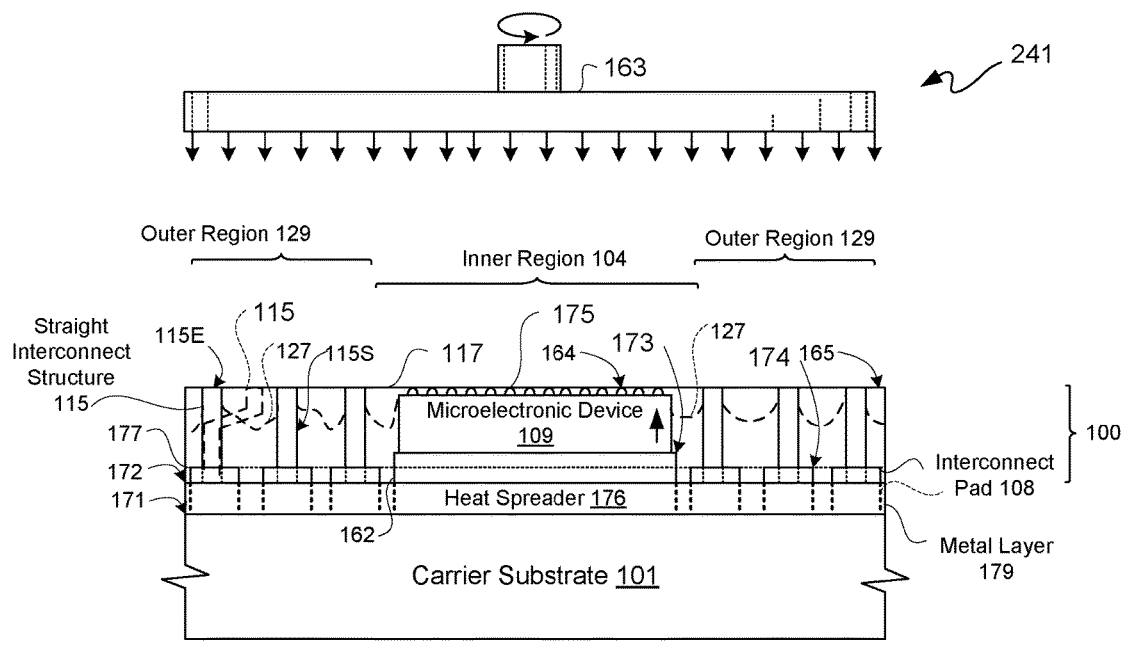
Figures 2, 6:
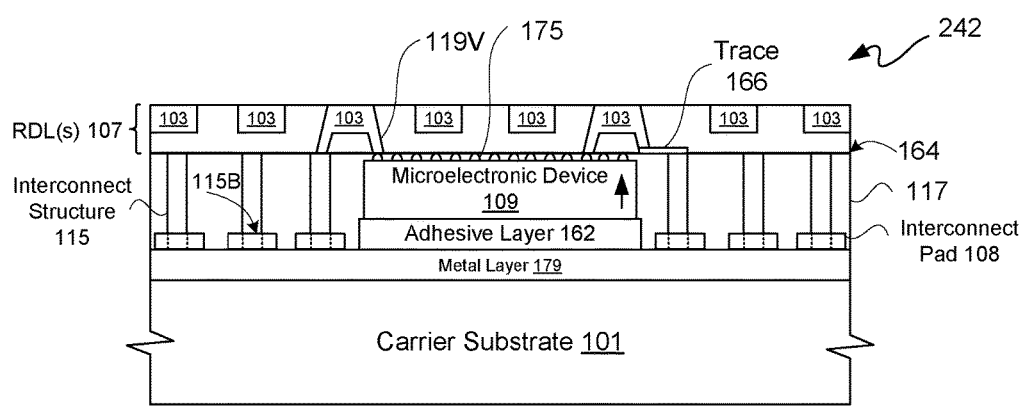
Figures 3A, 6:
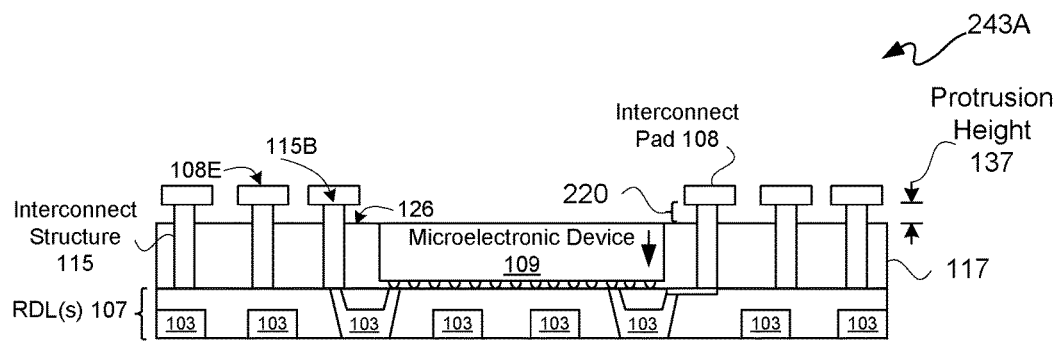

With reference to FIG. 6-3A, at 243A carrier 101 and metal layer 179 may be removed, and packaged device 100 may be inverted. Lower ends or bases 115B of interconnect structures 115 opposite upper ends 115E may protrude above an upper surface of dielectric layer 117, after inversion from the view illustratively depicted in FIG. 6-2. A distance or height 137 of such protrusions 220 may be to increase a warpage limit for a combination of at least packaged device 100 and one other packaged device 130 directly coupled to such protrusions 220 of interconnect structures 115. Thus, bases 115B after inversion may have interconnect pads 108 located thereon and thereabove with ends 108E of interconnect pads 108 opposite and over bases 115B.

At 243A adhesive layer 162 may be removed. Further, at 243A an upper portion of dielectric layer 117 may be etched back to lower upper surface 126 of dielectric layer 117. In this example, upper surface 126 is lowered down to an upper surface of microelectronic device 109 (as illustratively depicted) to provide a protrusion height 137. In this example, protrusion height 137 of protrusions 220 may be from upper surface 126 to bases 115B.

Figures 3B, 6:
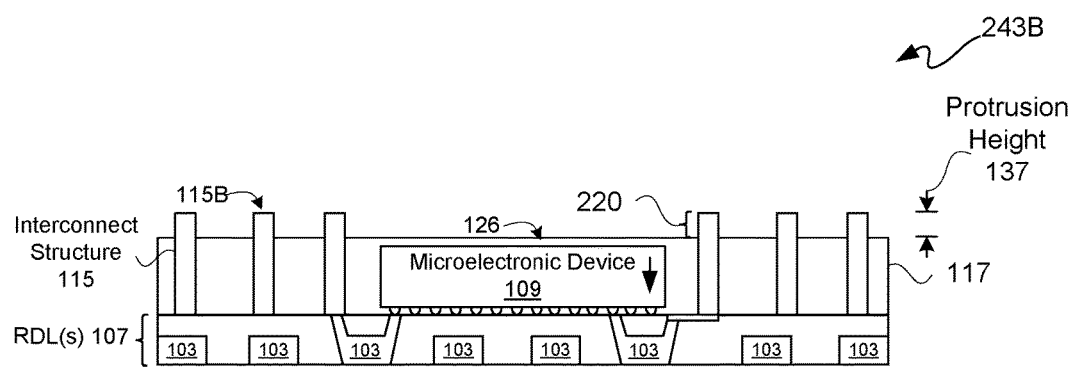

With reference to FIG. 6-3B, 243B is an optional example where interconnect pads 108 are not formed, such as for no metal layer 177 and metal layer 179 as a sacrificial layer. The remainder of operations at 243B are the same as at 243A, except in this example, upper surface 126 is lowered down to just above an upper surface (i.e., a lower surface prior to inversion) of microelectronic device 109 to provide a protrusion height 137. Again, protrusion height 137 of protrusions 220 may be from upper surface 126 to bases 115B.

Figures 4A, 6:
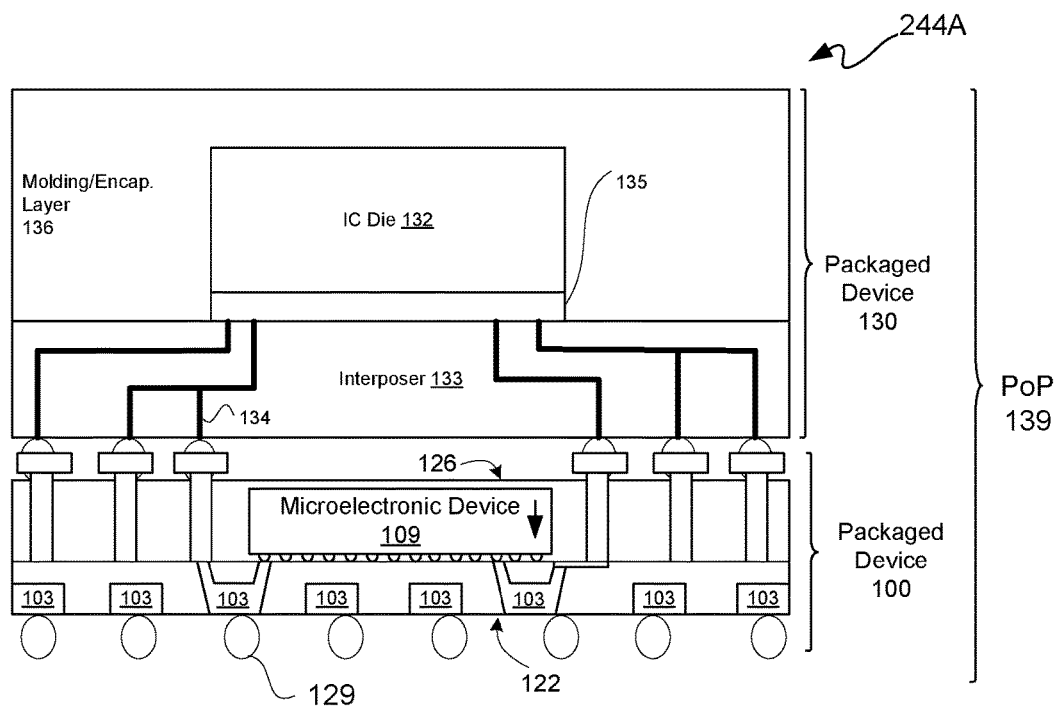
Figures 4B, 6:
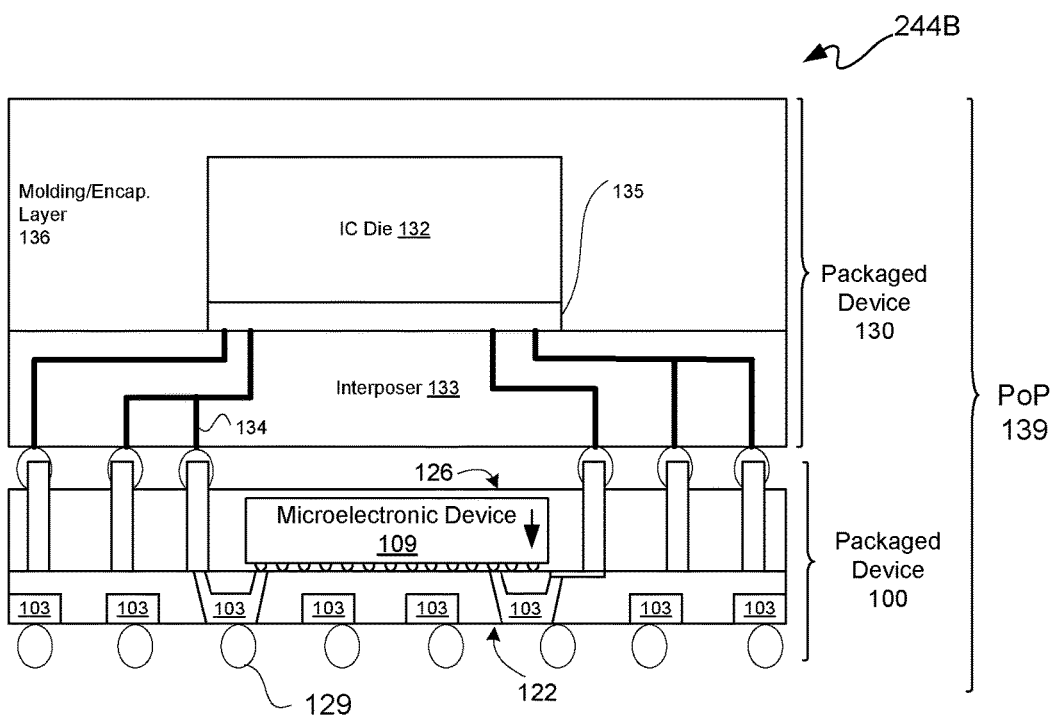
Figures 1, 7:
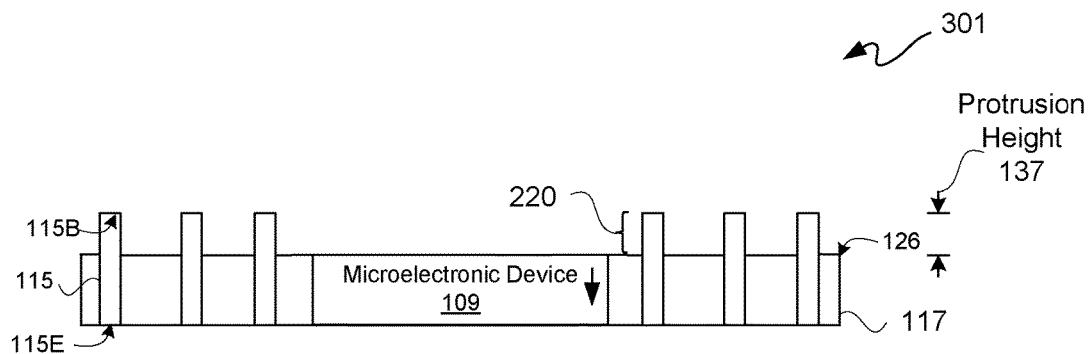
Figures 2, 7:
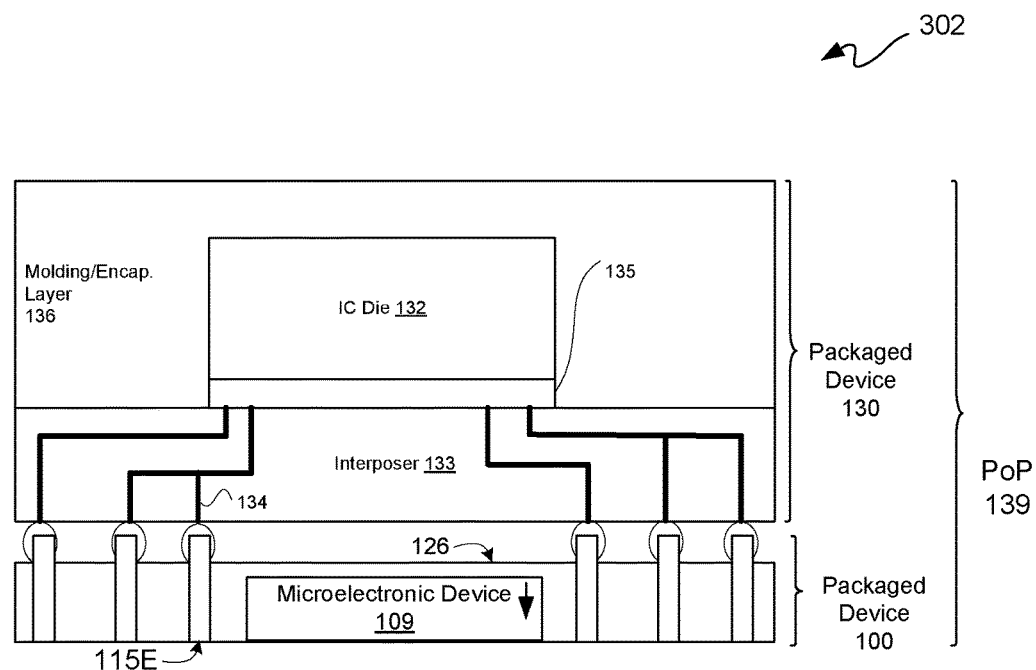
Figure 8:
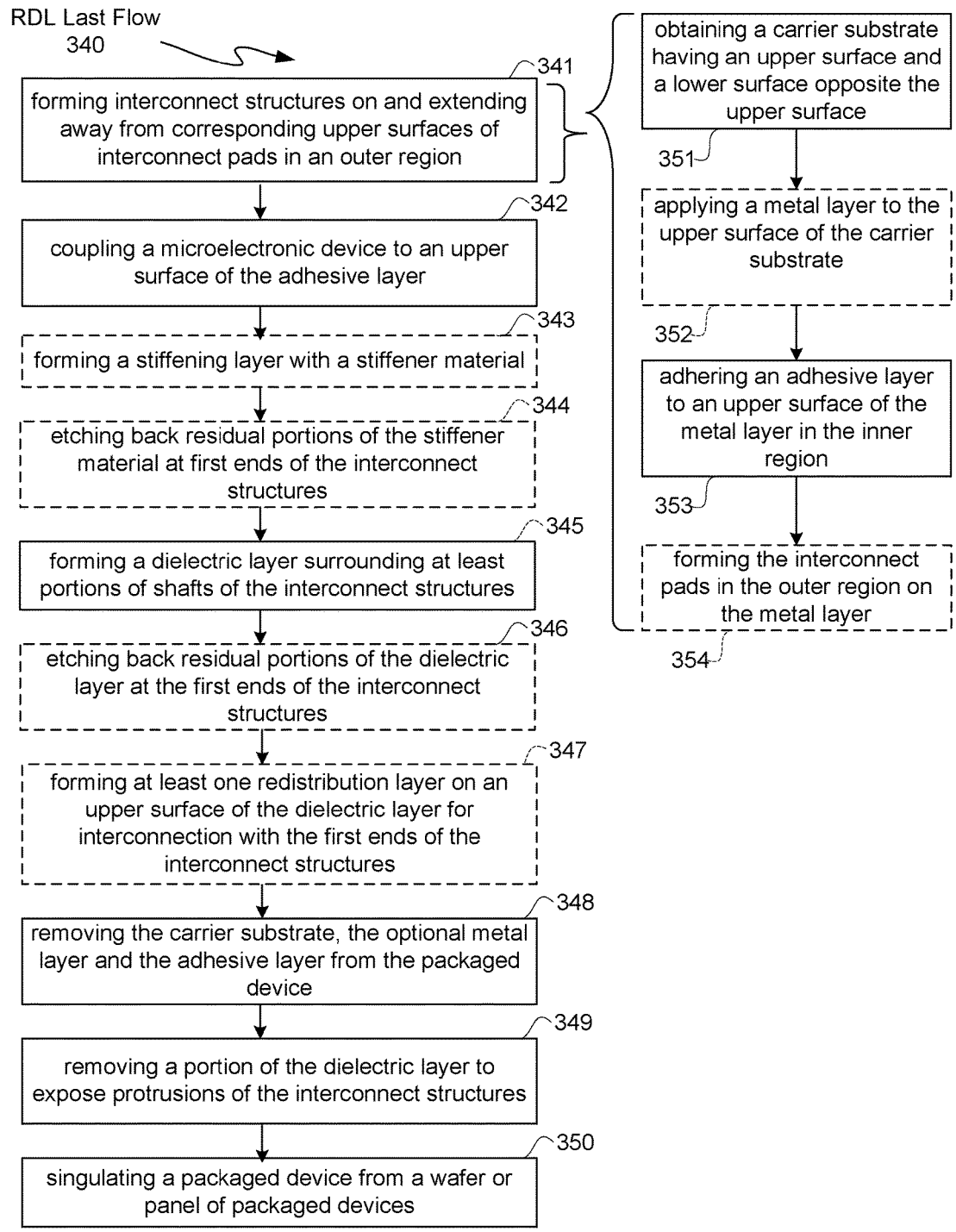

With reference to operations at 244A and 244B respectively illustratively depicted in FIGS. 6-4A and 6-4B, a packaged device 130 may be coupled to protrusions 220 of interconnect structures 115 with electrically conductive bonding masses 131 to provide respective PoPs 139. Same description is not repeated with respect to formation of PoPs 139 for purposes of clarity and not limitation.

Figures 1, 2, 3, 4, 5, 6, 7, 7A:
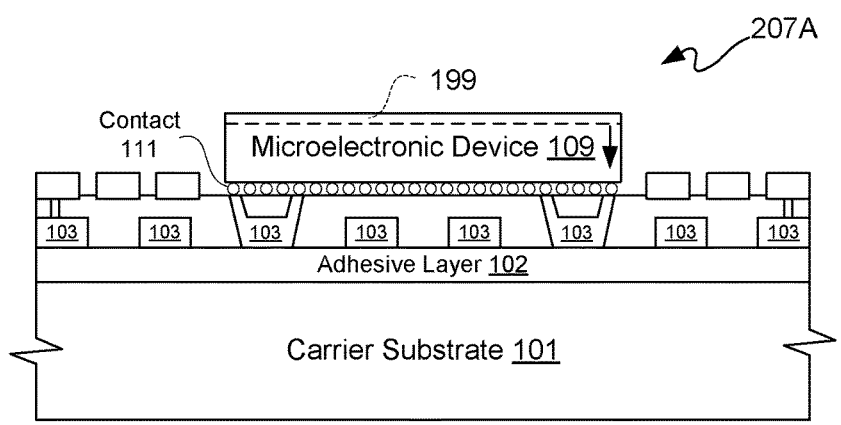
Figures 1, 2, 3, 4, 5, 6, 7, 7B:
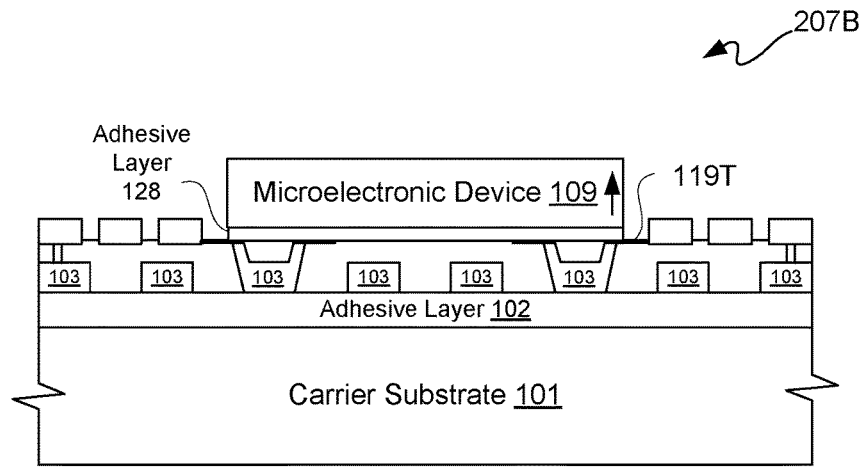

With reference to FIG. 7-1, packaged device 100 at 241 of FIG. 6-1 may be formed without interconnect pads 108 and without a redistribution layer 107 at 301. Moreover, in this example microelectronic device 109 is not pre-bumped, but may be pre-bumped in another implementation. Along those lines, lower ends 115E, previously upper ends, may be generally at a same level with a front-side surface of microelectronic device 109. Ends 115E and microelectronic device 109 may optionally be bumped for subsequent interconnection, such as a surface mount interconnection.

At 301 adhesive layer 162 may be removed. The remainder of operations at 301 are the same as at 243B, except in this example, upper surface 126 is lowered down to an upper surface (i.e., a lower surface prior to inversion) of microelectronic device 109 to provide a protrusion height 137. Again, protrusion height 137 of protrusions 220 may be from upper surface 126 to bases 115B.

With reference to operation at 302 illustratively depicted in FIG. 7-2, a packaged device 130 may be coupled to protrusions 220 of interconnect structures 115 with electrically conductive bonding masses 131 to provide a PoP 139. Same description is not repeated with respect to formation of PoP 139 for purposes of clarity and not limitation.

Figures 1, 2, 3, 4, 5, 6, 7, 8:
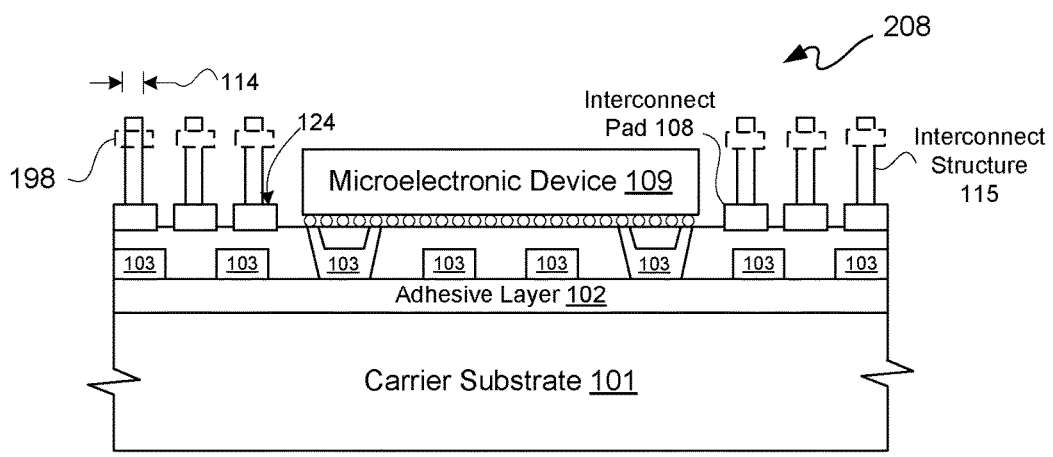
Figures 1, 2, 3, 4, 5, 6, 7, 8, 9:
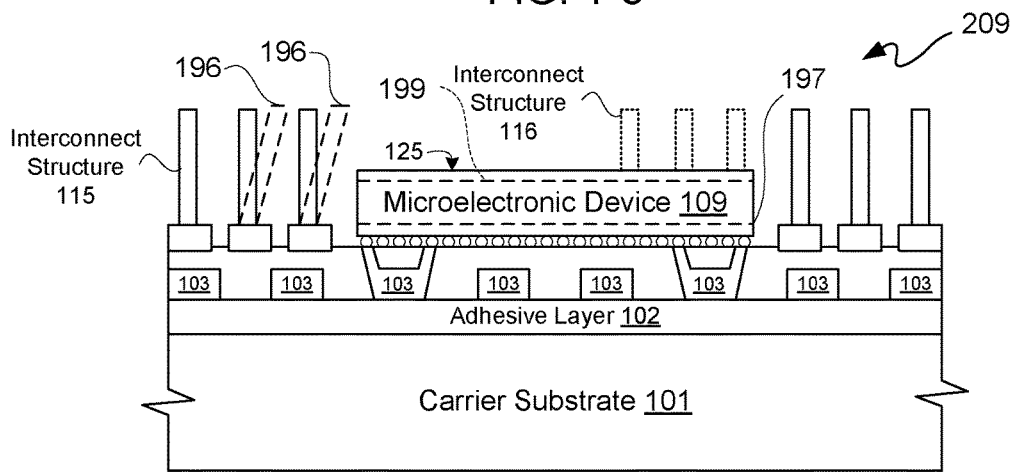
Figures 1, 2, 3, 4, 5, 6, 7, 8, 9, 10:
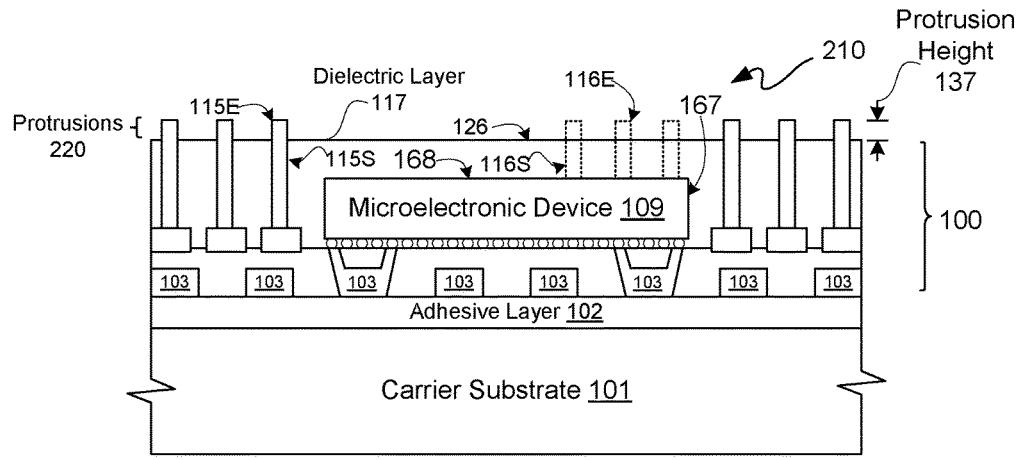
Figures 1, 2:
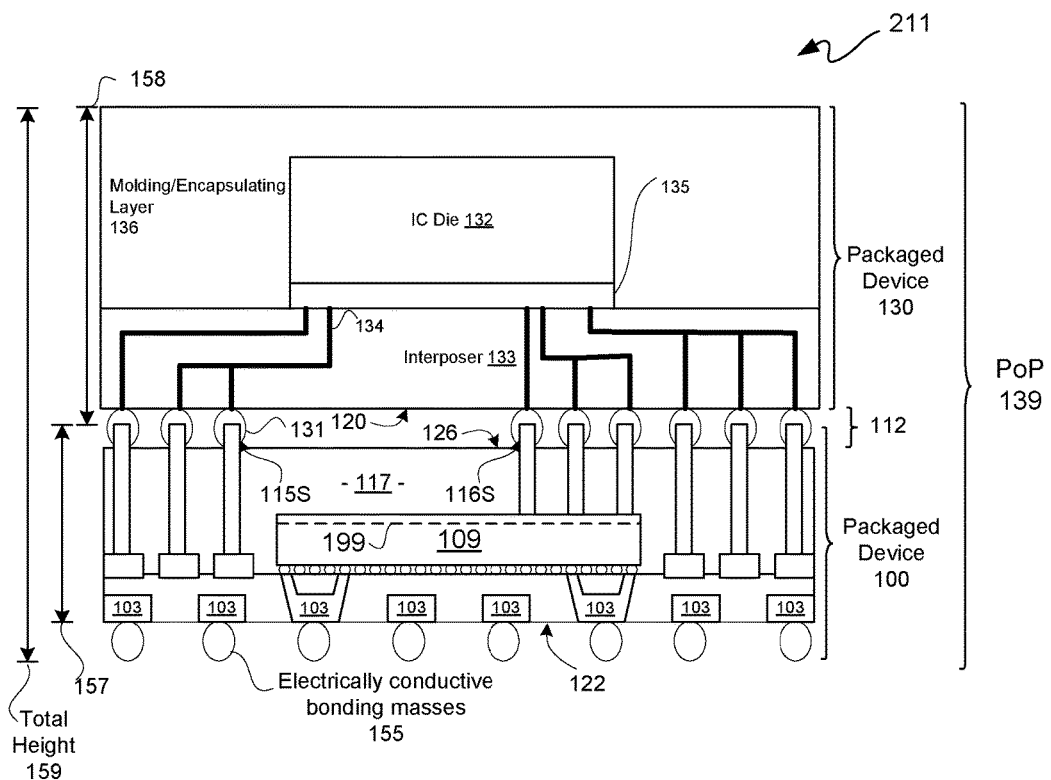
Figure 2:
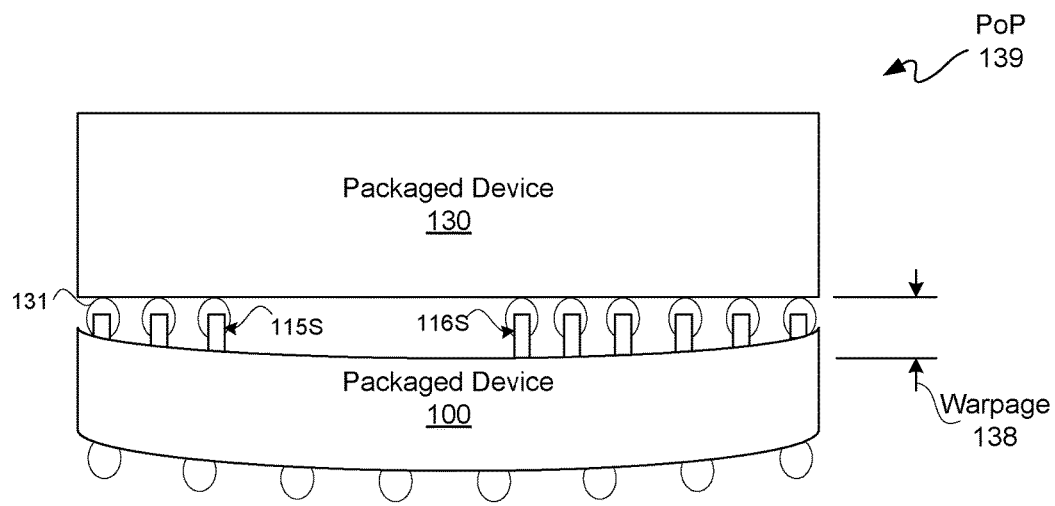
Figures 2, 3:
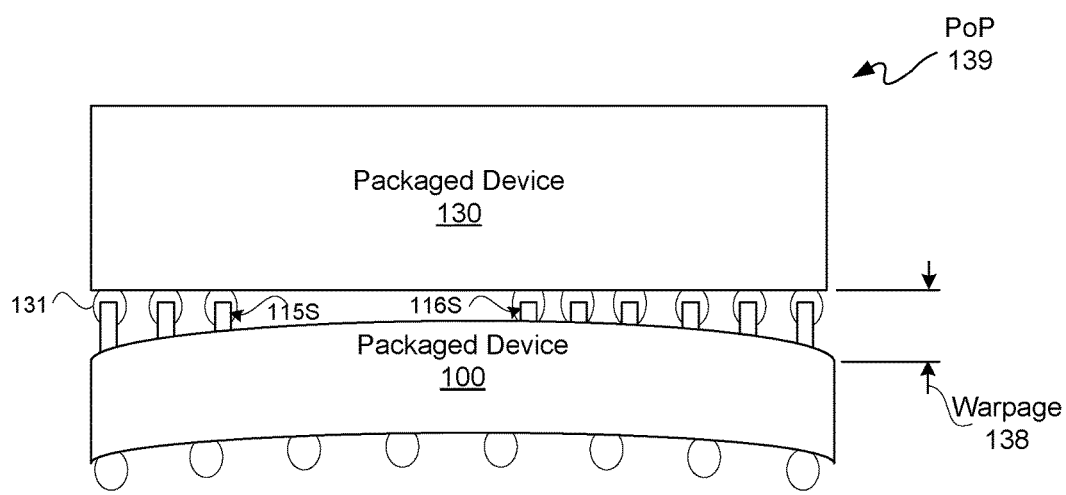
Figures 1, 3:
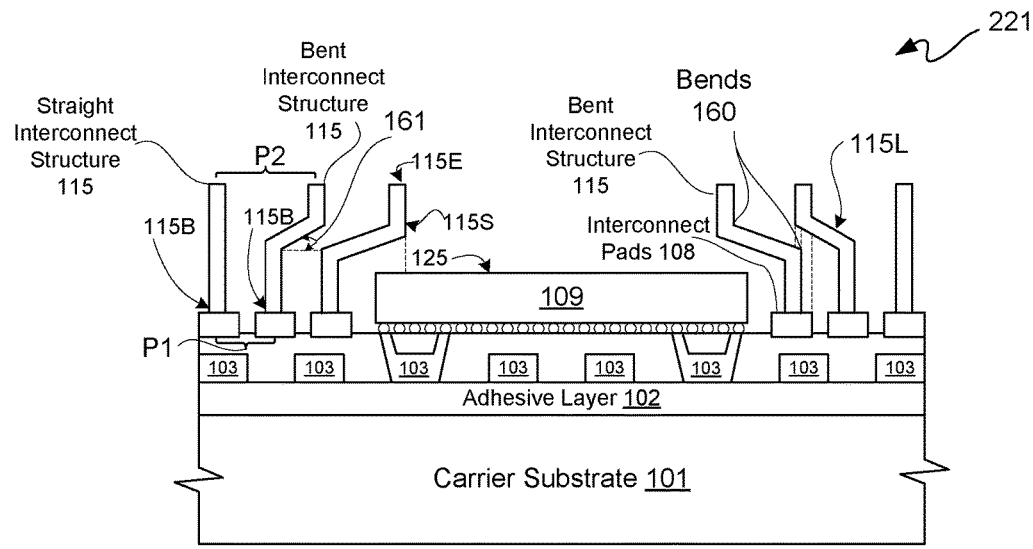
Figures 2, 3:
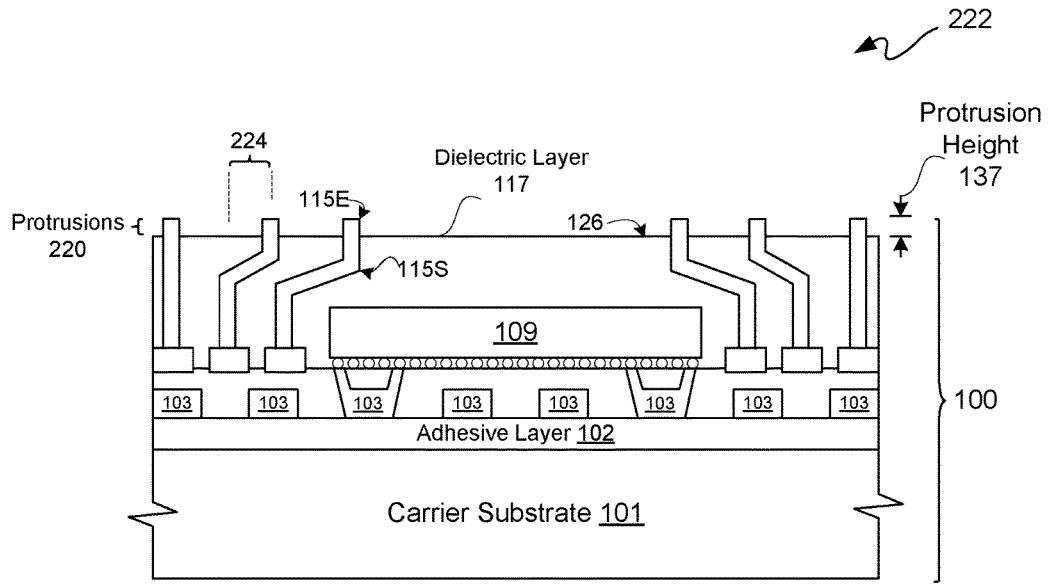
Figure 3:
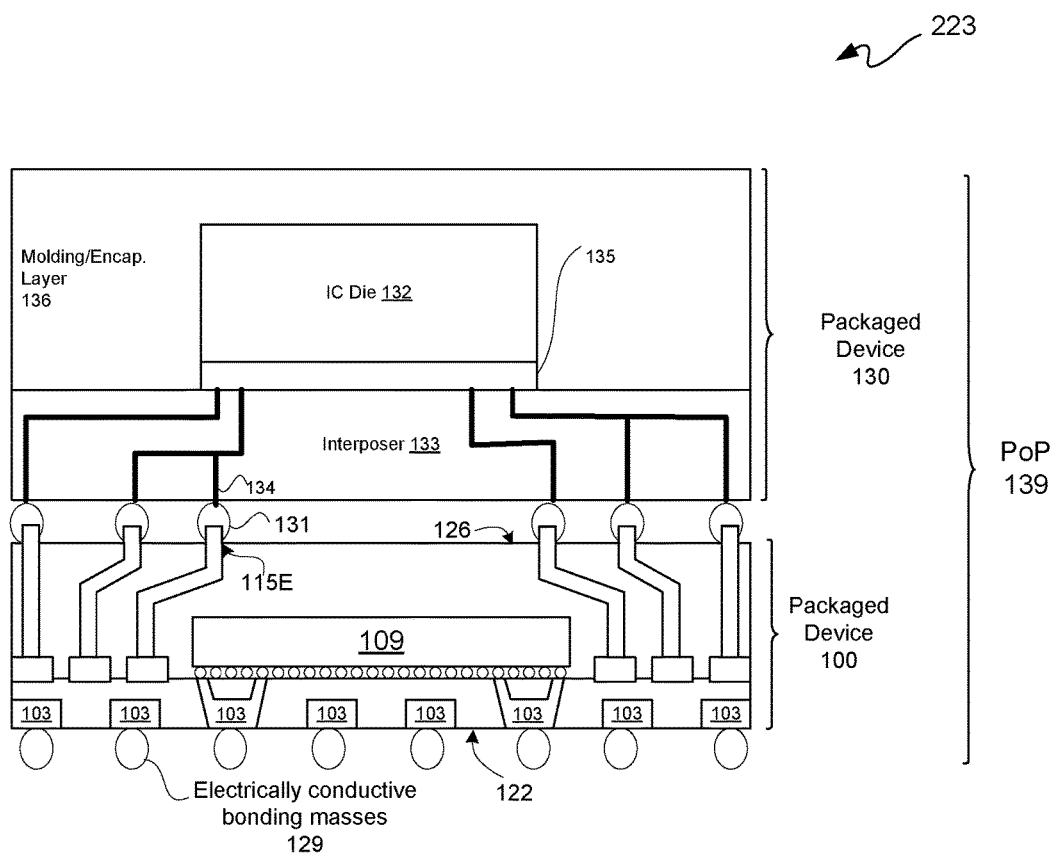
Figures 1, 4:
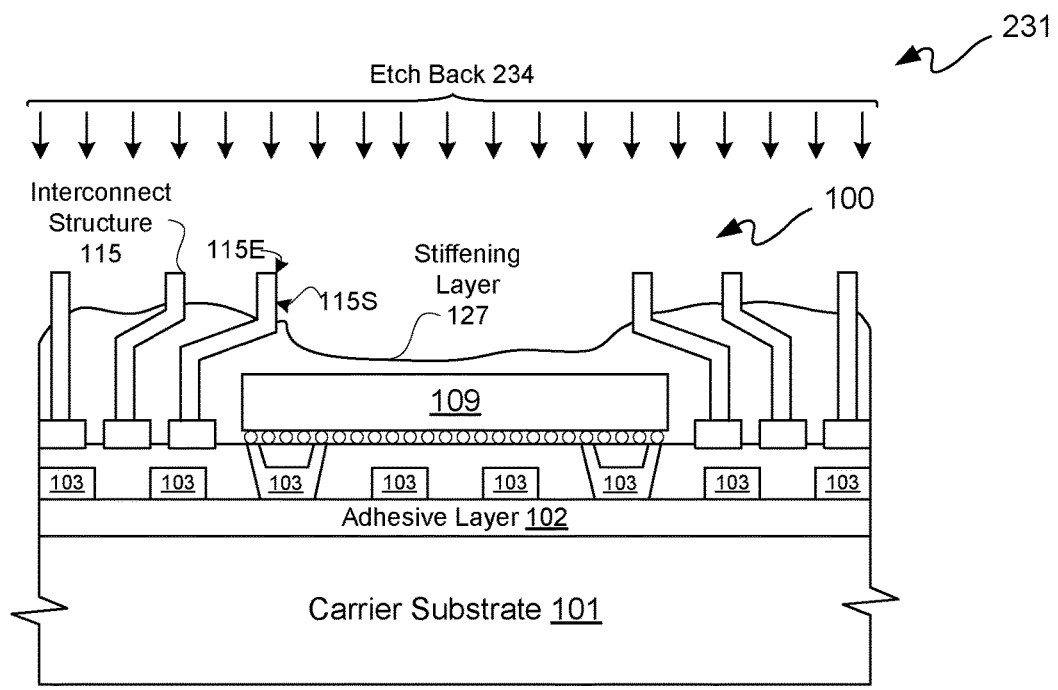
Figures 2, 4:
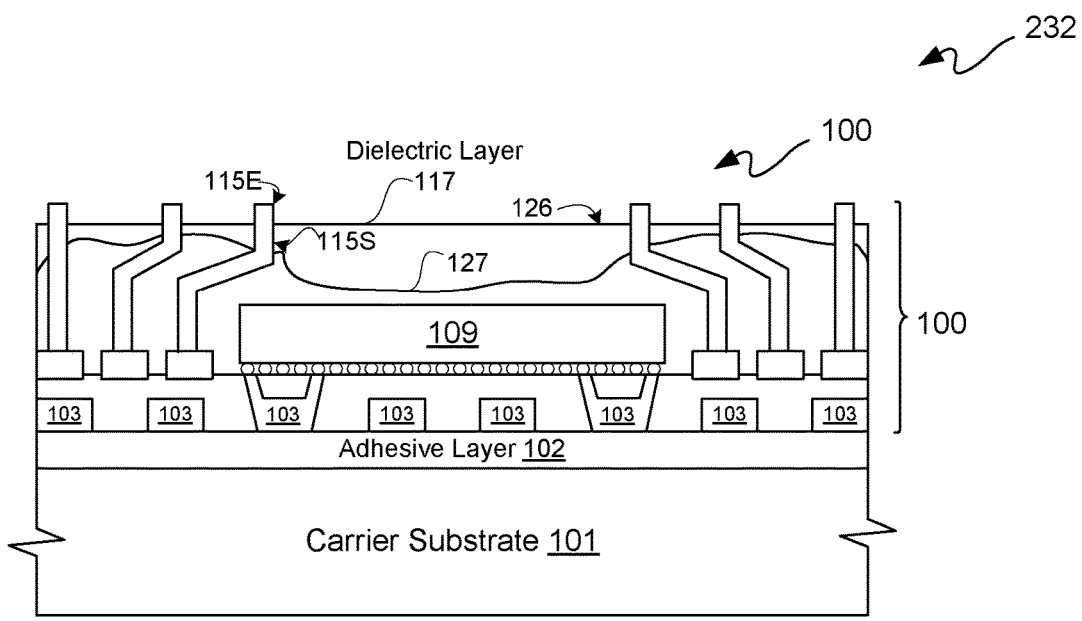
Figures 3, 4:
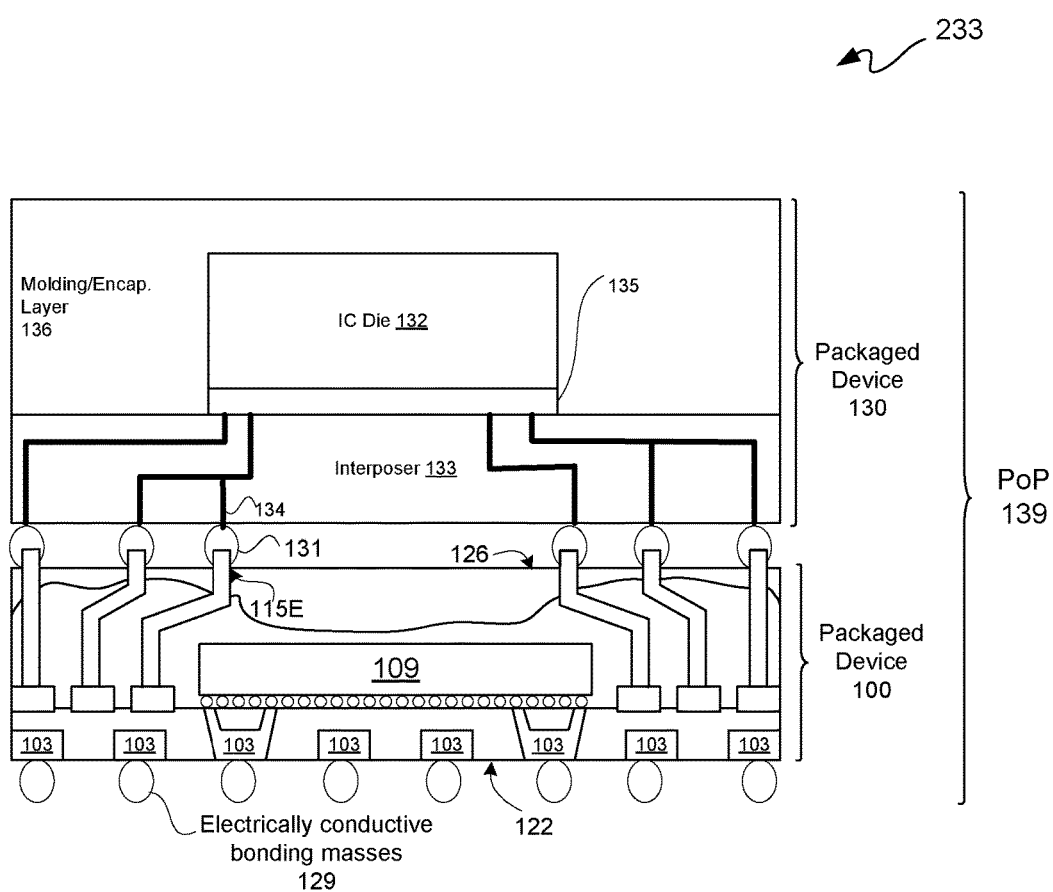
Figure 5:
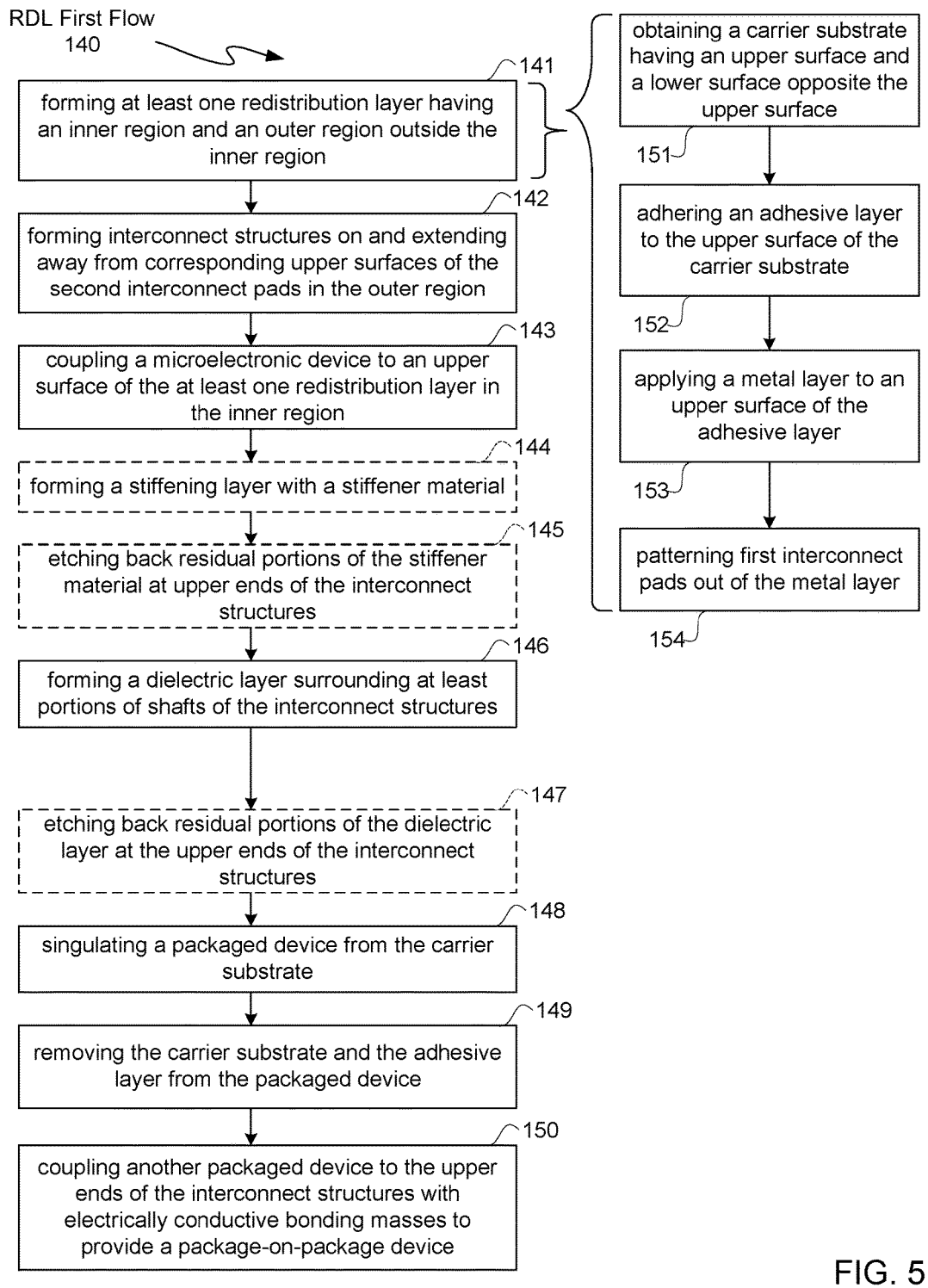

With reference to FIG. 8, a flow diagram illustratively depicts an exemplary "redistribution layer last" and "redistribution layer-less" process flow ("process flow") 340 for a packaged device 100. Process flow 340 follows from one or more of the above-described operations, and thus is a general recapitulation thereof for purposes of clarity and not limitation.

At 341 interconnect structures 115 are formed directly or indirectly on and extend away from corresponding upper surfaces of interconnect pads 108 in outer region 129. Formation at 341 may include at least some of operations 351 through 354.

At 351, a carrier substrate 101 having an upper surface and a lower surface opposite the upper surface is obtained. At 352, a metal layer 179 is optionally applied to an upper surface of carrier substrate 101.

At 353, an adhesive layer 102 is adhered to either the upper surface of carrier substrate 101 or metal layer 179. At 354, interconnect pads 108 are optionally patterned out of metal layer 177 and/or 179. Patterning at 354 may include forming an area array layout for a subset of first interconnect pads 103 in the inner region.

At 342, a microelectronic device 109 is coupled to an upper surface of adhesive layer 162 in inner region 104.

Optionally at 343, a stiffening layer 127 may be formed with a stiffener material. Optionally, at 344, residual portions of the stiffener material at upper or first ends of interconnect structures 115 are etched back.

At 345, a dielectric layer 117 is formed surrounding at least portions of shafts of interconnect structures 115. At 346, optionally residual portions of dielectric layer 117 at the upper ends of interconnect structures 115 are etched back.

At 347, at least one redistribution layer 107 in inner region 104 and outer region 129 outside the inner region is optionally formed on an upper surface of dielectric layer 117. At least one redistribution layer 107 may be formed to include interconnection with upper ends of interconnect structures 115. Such forming of at least one redistribution layer 107 may include forming interconnect pads 103, traces 166, and/or vias 119V in inner region 104 and/or outer region 129 of at least one redistribution layer 107.

At 348, carrier substrate 101, optional metal layer 179 and adhesive layer 162 can be removed from packaged device 100.

At 349, such in-process substrate assembly for packaged device 100 may be etched back to remove a lower portion of dielectric layer 117 to expose protrusions 220 of interconnect structures 115. Operations at 349 may include inversion of such packaged device 100 for removal of what was a lower portion of dielectric layer 117.

At this juncture, interconnect structures 115 have what were lower ends, now upper ends, protruding above what is now an upper surface of dielectric layer 117 a distance to increase a warpage limit. Increased warpage limit is for a combination of at least packaged device 100 and one other packaged device 130 directly coupled to protrusions 220 of interconnect structures 115.

At 350, a packaged device 100 may be singulated from a wafer or panel of such packaged devices 100. For forming a PoP 139, optionally another packaged device 130 is coupled to what were lower ends 115E, now upper ends 115E, of interconnect structures 115 with electrically conductive bonding masses 131 to provide a PoP 139, such as previously described and not repeated for purposes of clarity.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. A method for forming a packaged microelectronic device, comprising:
    forming at least one redistribution layer having an inner region and an outer region outside the inner region;
    the forming of the at least one redistribution layer comprising forming first interconnect pads in both the inner region and the outer region at a lower surface and second interconnect pads in the outer region at an upper surface of the at least one redistribution layer;
    forming interconnect structures on and extending away from corresponding upper surfaces of the second interconnect pads in the outer region;
    coupling a microelectronic device to an upper surface of the at least one redistribution layer in the inner region;
    forming a reinforcing layer with a stiffener material on the interconnect structures;
    forming a dielectric layer surrounding at least portions of shafts of the interconnect structures and along sides of the microelectronic device; and
    the interconnect structures having upper ends thereof protruding above an upper surface of the dielectric layer a distance.

2. The method according to claim 1, wherein the forming of the at least one redistribution layer comprises:
    obtaining a carrier substrate having an upper surface and a lower surface opposite the upper surface;
    adhering an adhesive layer to the upper surface of the carrier substrate;
    applying a metal layer to an upper surface of the adhesive layer; and
    patterning the first interconnect pads out of the metal layer including forming an area array layout for a subset of the first interconnect pads in the inner region.

3. The method according to claim 2, wherein:
    the metal layer is a metal foil; and
    the adhesive layer is an adhesive tape.

4. The method according to claim 1, wherein the interconnect structures include plating-formed posts plated in part on the upper surfaces of the second interconnect pads.

5. The method according to claim 1, wherein the interconnect structures include wire bond wires bonded to the upper surfaces of the second interconnect pads.

6. The method according to claim 1, wherein the interconnect structures are first interconnect structures, the packaged microelectronic device further comprising:
forming second interconnect structures on and extending away from an upper surface of the microelectronic device;
the forming of the dielectric layer including surrounding at least portions of shafts of the second interconnect structures; and
the second interconnect structures having upper ends thereof protruding above the upper surface of the dielectric layer the distance.

7. The method according to claim 6, wherein the packaged device is a first packaged device, the method further comprising coupling a second packaged microelectronic device to the protrusions of the first and the second interconnect structures with electrically conductive bonding masses to provide a package-on-package device.

8. The method according to claim 1, wherein the packaged device is a first packaged device, the method further comprising coupling a second packaged microelectronic device to the protrusions of the interconnect structures with electrically conductive bonding masses to provide a package-on-package device.

9. The method according to claim 1, wherein the upper ends of at least some of the interconnect structures protruding above the upper surface of the dielectric layer are laterally displaced with respect to corresponding bases of the interconnect structures.

10. The method according to claim 1, wherein portions of the stiffener material wick-up at least a portion of the interconnect structures.

11. A packaged microelectronic device, comprising:
at least one redistribution layer having an inner region and an outer region outside the inner region;
the at least one redistribution layer comprising first interconnect pads in both the inner region and the outer region on a lower surface and second interconnect pads in the outer region on an upper surface of the at least one redistribution layer;
interconnect structures on and extending away from corresponding upper surfaces of the second interconnect pads in the outer region;
a microelectronic device coupled to an upper surface of the at least one redistribution layer in the inner region;
a reinforcing layer formed with a stiffener material on the interconnect structures;
a dielectric layer surrounding at least portions of shafts of the interconnect structures and along sides of the microelectronic device; and
the interconnect structures having upper ends thereof protruding above an upper surface of the dielectric layer a distance.

12. The packaged microelectronic device according to claim 11, wherein the first interconnect pads include an area array layout for a subset of the first interconnect pads in the inner region.

13. The packaged microelectronic device according to claim 11, wherein the interconnect structures include plating-formed posts plated in part on the upper surfaces of the second interconnect pads.

14. The packaged microelectronic device according to claim 11, wherein the interconnect structures include wire bond wires bonded to the upper surfaces of the second interconnect pads.

15. The packaged microelectronic device according to claim 11, wherein the interconnect structures are first interconnect structures, the packaged microelectronic device further comprising:
second interconnect structures on and extending away from an upper surface of the microelectronic device;
the dielectric layer formed to surround at least portions of shafts of the second interconnect structures; and
the second interconnect structures having upper ends thereof protruding above the upper surface of the dielectric layer the distance.

16. The packaged microelectronic device according to claim 11, wherein the packaged microelectronic device is a first packaged microelectronic device, the first packaged microelectronic device being coupled to a second packaged microelectronic device, the second packaged microelectronic device coupled to the protrusions of the interconnect structures with electrically conductive bonding masses to provide a package-on-package device.

17. The packaged microelectronic device according to claim 11, wherein the upper ends of at least some of the interconnect structures protruding above the upper surface of the dielectric layer are laterally displaced with respect to corresponding bases of the interconnect structures.

18. The packaged microelectronic device according to claim 11, wherein:
portions of the stiffener material wick-up at least portions of the interconnect structures; and
the stiffener material is a polymeric material.

* * * * *